United States Patent
Watanabe et al.

(10) Patent No.: US 6,717,842 B2
(45) Date of Patent: Apr. 6, 2004

(54) STATIC TYPE SEMICONDUCTOR MEMORY DEVICE WITH DUMMY MEMORY CELL

(75) Inventors: Tetsuya Watanabe, Hyogo (JP); Koji Nii, Hyogo (JP); Yasunobu Nakase, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/339,324

(22) Filed: Jan. 10, 2003

(65) Prior Publication Data

US 2004/0027852 A1 Feb. 12, 2004

(30) Foreign Application Priority Data

Aug. 9, 2002 (JP) ........................................ 2002-232774

(51) Int. Cl.$^7$ .............................................. G11C 11/00
(52) U.S. Cl. .......................... 365/154; 365/210; 365/200
(58) Field of Search ................................ 365/154, 210, 365/200, 156

(56) References Cited

U.S. PATENT DOCUMENTS 6,285,604 B1 * 9/2001 Chang ........................ 365/200
6,490,214 B2 * 12/2002 Kawasumi .................. 365/210
6,556,472 B2 * 4/2003 Yokozeki .................... 365/154

FOREIGN PATENT DOCUMENTS

JP 11-339476 12/1999

OTHER PUBLICATIONS

Kenichi Osada et al., "Universal–Vdd 0.65–2.0V 32kB Cache using Voltage–Adapted Timing–Generation Scheme and a Lithographical–Symmetric Cell", 2001 IEEE International Solid–State Circuits Conference, Feb. 6, 2001.
Related U.S. patent application of Tetsuya Watanabe et al., assigned to : Mitsubishi Denki Kabushiki Kaisha, filed Dec. 27, 2002 (Our Ref: 57454–851).

* cited by examiner

Primary Examiner—Huan Hoang
(74) Attorney, Agent, or Firm—McDermott, Will & Emery

(57) ABSTRACT

The dummy cell of the SRAM corresponds to a normal memory cell of which first and second P-channel MOS transistors for loading are replaced by the first and the second N-channel MOS transistors, of which gate and source are provided with power supply potential and ground potential, respectively. When a word line rises to "H" level, third and fourth N-channel MOS transistors for accessing are rendered conductive, to pass current from dummy bit line to a line of ground potential via the third N-channel MOS transistor, the first N-channel MOS transistor, and a fifth N-channel MOS transistor for driving. Accordingly, speed of potential decrease of the dummy bit line may be faster than that of bit line. Hence, operational timing can easily be optimized, and operational margin can be increased.

9 Claims, 22 Drawing Sheets

STATIC TYPE SEMICONDUCTOR MEMORY DEVICE WITH DUMMY MEMORY CELL

BACKGROUND OF THE INVENTION

1. Field of the Invention

The present invention relates to a static type semiconductor device, and specifically, to a static type semiconductor memory device including a memory cells each provided at crossing portion of a word line and first and second bit lines, and a dummy memory cell provided at a crossing portion of a word line and first and second dummy bit lines.

2. Description of the Background Art

Conventionally, a method of increasing the speed and reducing power dissipation of a static random access memory (hereinafter referred to as an SRAM) using a dummy memory cell has been proposed. For example, Japanese Patent Laying-Open No. 11-339476 discloses a method using a dummy memory cell. In the method, when potential of a word line corresponding to an address signal is changed to a select level, the dummy memory cell is activated simultaneously with a regular memory cell to output a prescribed read signal. According to this method, as potential of the word line is changed to a select level, the level of read signal is changed by a dummy memory cell corresponding to the word line. In response to the level change of the read signal, the word line may be lowered to a non-select level or a sense amplifier may be activated to read data signal. Accordingly, wasteful discharge of a bit line may be eliminated to attain low power dissipation, or activation timing of a sense amplifier and precharge may be optimized to attain reduction of reading cycle time.

Usually, a transistor in a memory cell is designed to be as small as possible to achieve higher integration of the memory cell. As a result, when potential of a bit line is lowered by a memory cell, the potential change occurs slowly and potential difference between the pair of bit lines will be very small. As such, a differential sense amplifier circuit of higher sensitivity is used for detecting read data signal sensing small potential difference between the pair of bit lines in order to attain high-speed read operation. According to the method of Japanese Patent Laying-Open No. 11-339476, however, since only one dummy cell is activated by the selected word line, the potential change timing of a signal line carrying read signal from the dummy cell, i.e., the dummy bit line, will be identical to that of the regular bit line. Thus, the change of dummy bit line potential will also be very small. In effect, when sensing read signal with a level sensing circuit such as an inverter, a long time period is required until the potential of dummy bit line is pulled down lower than the threshold potential of the inverter, and thus optimal timing can not be attained.

Additionally, with a single dummy memory cell being activated, margins must be maintained, considering variations in pull-down current value of the selected dummy memory cell and that of regular memory cell, i.e., the current drawn from bit lines by the memory cell and dummy memory cell. As downscaling advances and fine processing becomes practical, variations in finished shape and in injection dose of impurities, and thus in transistor characteristics, become wider. Lower voltage results in higher degree of variation. Thus, the characteristics of transistors in dummy memory cells will be varied among cells. For example, a dummy memory cell which is activated by a particular selectively driven word line may tends to have transistors with superior characteristics resulting in rapid potential change of dummy bit line, while a regular memory cell may conversely tends to have transistors with poor characteristics resulting in slow potential change of regular bit line, in which case malfunction may occur due to the premature timing of pulling down potential of word line or of activating sense amplifier. In an attempt to avoid such situation, to maintain margin for achieving stable operation even under the worst condition will only delay the sensing timing of read signal against the original intention, and thus desired high-speed and reduced power dissipation can not be attained.

One article (ISSCC 2001, "Universal-Vdd 0.65–2.0V 32 kB Cache using Voltage-Adapted Timing-Generation Scheme and a Lithographical-Symmetric Cell") describes a scheme to pull down potential of a dummy bit line by a plurality of dummy memory cells, in order to average the variation of the characteristics of transistors for advancing output timing of read signal, in consideration of the aforementioned problem. According to this article, however, since the dummy memory cells are activated by the dummy word lines, the dummy bit line is pulled down at a timing earlier than the activation timing of the regular memory cells. As such, though margin is increased by averaging pull down speed using a plurality of dummy memory cells and thus addressing the variation, difference between the rising timing of dummy word lines and that of regular word lines must be considered on designing, which disadvantageously involves redesigning of timing when the configuration of memory cell array is changed. When applying this scheme to a variety of bit/word configurations required in the system LSI and the like, timings must be optimally designed for each case, and thus enormous period of designing and developing will be needed.

SUMMARY OF THE INVENTION

Therefore, the main object of the present invention is to provide a static type semiconductor memory device capable of optimizing operational timing with increased operational margin.

A static type semiconductor memory device of the present invention includes a memory cell arranged at crossing portion of a word line and first and second bit lines, and a dummy memory cell arranged at crossing portion of the word line and first and second dummy bit lines. The memory cell includes two P-channel MOS transistors for loading, two N-channel MOS transistors for driving, and two N-channel MOS transistors for accessing, and in response to corresponding word line being changed to select level, lowers potential of one of the first and second bit lines precharged at power supply potential to ground potential via one N-channel MOS transistor for accessing and one N-channel MOS transistor for driving. The dummy cell includes first and second N-channel MOS transistors provided corresponding to two P-channel MOS transistors for loading, third and fourth N-channel MOS transistors provided corresponding to two N-channel MOS transistors for driving, and fifth and sixth N-channel MOS transistors for accessing, and in response to the word line being changed to select level, lowers potential of the first dummy bit line, of the first and second dummy bit lines precharged to the power supply potential, to the ground potential via the fifth N-channel MOS transistor and at least two of the first to fourth N-channel MOS transistors connected in parallel. Accordingly, since potential of first dummy bit line decreases more quickly than that of the first or the second bit line, timing for changing word line to non-select line and the like can easily be optimized. Additionally, since potential of the first dummy bit line is lowered by the fifth N-channel MOS transistor for accessing and two N-channel MOS transistor connected in parallel, even when the characteristics of the first to the sixth N-channel MOS transistors in the dummy memory cell vary, degree of the variation can be averaged to be smaller, and hence increased operational margins can be attained.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
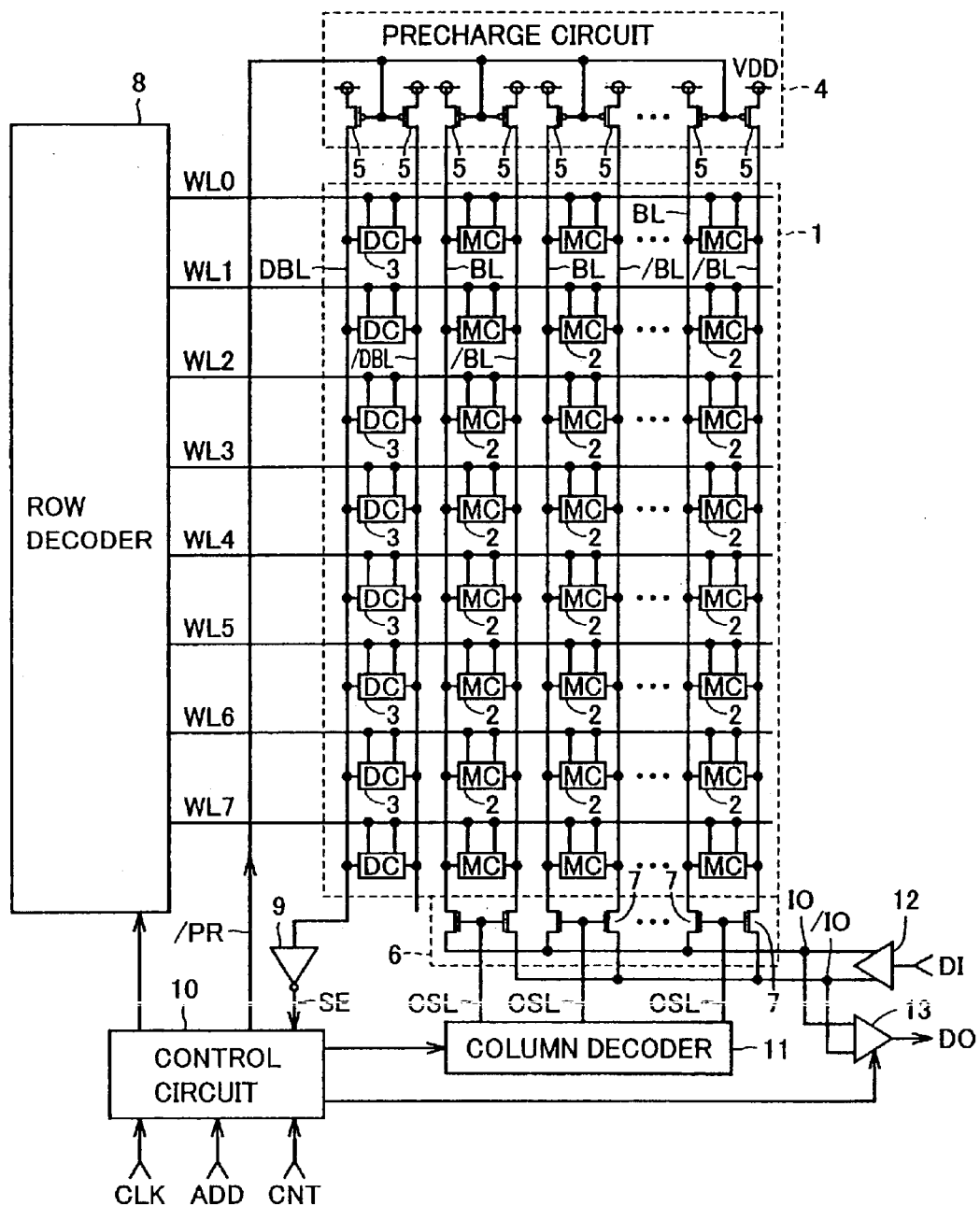
FIG. 1 is a circuit block diagram showing overall SRAM according to a first embodiment of the present invention.

FIG. 1 is a circuit block diagram showing overall configuration of an SRAM according to a first embodiment of the present invention. In FIG. 1, the SRAM includes a memory cell array 1, a precharge circuit 4 and a column selecting gate 6. Memory cell array 1 includes a plurality of memory cells (MC) 2 arranged in a plurality of rows (eight rows in the figure) and columns, eight word lines WL0 to WL7 respectively provided corresponding to eight rows, and a plurality of bit line pairs BL, /BL provided corresponding to a plurality of columns. Each of memory cells 2 is connected to corresponding word line WL and corresponding bit line pair BL, /BL to store one data signal.

Further, memory cell array 1 includes eight dummy memory cells (DC) 3 arranged in eight rows and one column, and a dummy bit line pair DBL, /DBL. Dummy memory cell (DC) 3 is connected to a corresponding word line WL and a corresponding bit line pairs BL, /BL, and causes potential of dummy bit line DBL to fall to "L" level in response to the corresponding word line WL being changed to "H" of select level. The current drivability of dummy memory cell 3 is set at higher value higher than that of memory cell 2.

Precharge circuit 4 includes a P-channel MOS transistor 5 provided corresponding to each bit line BL, /BL, DBL, and /DBL. P-channel MOS transistor 5 is connected between a power-supply potential VDD line and one end of corresponding bit line BL, IBL, DBL or /DBL, and its gate receives bit line precharge signal /PR. As bit line precharge signal /PR is changed to the activation level of "L" level, P-channel MOS transistor 5 is rendered conductive to charge bit line to "H" level.

Column selecting gate 6 includes a pair of N-channel MOS transistors 7, 7 provided corresponding to each bit line pair BL, /BL. N-channel MOS transistors 7, 7 are respectively connected between the other end of corresponding bit line BL, /BL and data input/output line IO, /IO, and their gates are connected to corresponding column select lines CSL. As one of column select lines CSL rises to the select level of "H", bit line pair BL, /BL of the column corresponding to the column select line CSL is connected to data input/output line pair IO, /IO via N-channel MOS transistors 7, 7.

Further, this SRAM includes a row decoder 8, an inverter 9, a control circuit 10, a column decoder 11, a write circuit 12 and read circuit 13. Row decoder 8 selects any one of the plurality of word lines WL0 to WL7 according to a row address signal provided by control circuit 10, and changes the word line to the select level of "H" to activate dummy memory cell 3 and a plurality of memory cells 2 corresponding to the word line.

Inverter 9 has a prescribed threshold potential and, in response to potential of dummy bit line DBL attaining lower than the threshold potential, raises the signal SE to the activation level of "H" level. Inverter 9 forms a potential sensing circuit. Control circuit 10 controls the overall SRAM according to output signal SE of inverter 9, and clock signal CLK, address signal ADD and control signal CNT which are provided from the external of the circuit. According to the external address signal ADD, control circuit 10 generates row address signal and column address signal and provide them to row decoders 8, 11, respectively.

Row decoder 11 selects any one of column select lines CSL according to the row address signal provided by control circuit 10, and changes the column selection line CSL to the select level of "H" to connect bit line pair BL, IBL corresponding to that column select line CSL and data input/output line pair IO, /IO.

Write circuit 12 and read circuit 13 are both connected to data input/output line pair IO, /IO. Write circuit 12 writes data signal DI, provided from external, into memory cell 2 selected by row decoder 8 and column decoder 11. Read circuit 13 includes sense amplifier to output read data signal DO from memory cell 2 selected by row decoder 8 and column decoder 11.

Figure 2:
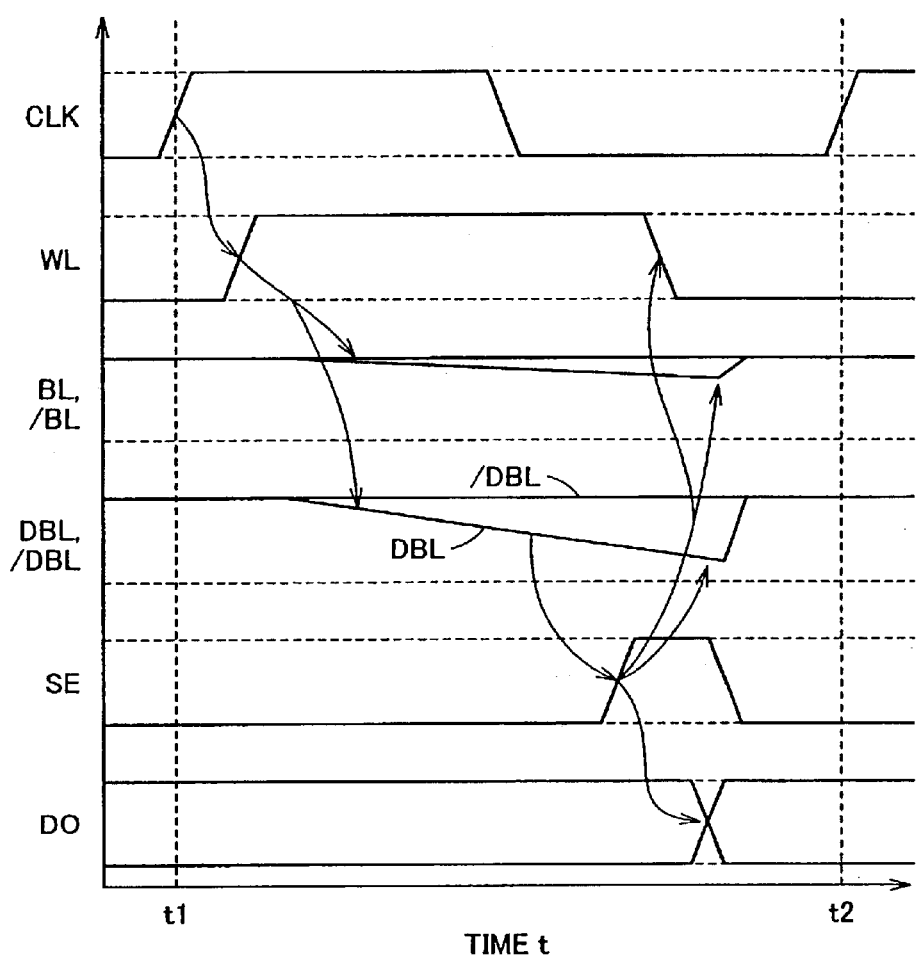
FIG. 2 is a time chart showing the operation of the SRAM shown in FIG. 1.

FIG. 2 is a timing chart showing read operation of the SRAM shown in FIG. 1. In FIG. 2, at the step before read operation is initiated, all word lines WL0 to WL7 are at the non-select level of "L", while each of bit lines BL, /BL and dummy bit lines DBL, /DBL is precharged to "H" level by precharge circuit 4, and signal SE is set at "L" level.

As clock signal CLK rises from "L" level to "H" level to initiate read operation (at time point t1), bit line precharge signal /PR is changed to non-activated level of "H" to render P-channel MOS transistor 5 of precharge circuit 4 non-conductive, and the row and column specified by address signal ADD is selected by row decoder 8 and column decoder 11. Word line WL of the selected row rises from "L" level to "H" level. Additionally, column select line CSL of the selected column is changed to the select level of "H" to connect bit line pair BL, /BL of that column to data input/output line pair IO, /IO via N-channel MOS transistors 7, 7.

For example, if word line WL0 of the first row is changed to "H" level, then data signals of each of memory cells 2 are read to corresponding bit lines BL, /BL, and potential of either one of the bit lines decreases gradually. Additionally, dummy memory cell 3 connected to word line WL0 is activated, and potential of dummy bit line DBL decreases gradually. Current drivability of each memory cell 2 and dummy memory cell 3 is set so that the speed of potential decrease of dummy bit line DBL is faster than that of bit line BL or /BL. It should be noted that potential of dummy bit line /DBL remains at "H". As potential of dummy bit line DBL decreases lower than threshold potential of inverter 9 which is a potential sensing circuit, output signal SE of inverter 9 rises from "L" level to "H" level.

As signal SE rises from "L" level to "H" level, read circuit 13 is activated, read data signal DO is determined, bit line precharge signal /PR falls to deactivate memory cell 2 and dummy memory cell 3, and bit line precharge signal /PR is changed to "L" level to precharge bit lines BL, /BL and dummy bit lines DBL, IDBL to "H" level.

In writing operation, word line WL of the row selected by row address signal rises to the select level of "H" decoder 8, and each memory cell 2 is activated in the row. Additionally, column select line CSL specified by row address signal rises to the select level of "H" by column decoder 11, thus N-channel MOS transistors 7, 7 of that column are rendered conductive, and one activated memory cell 2 is connected to write circuit 12 via bit line pair BL, /BL and data input/output line pair IO, /IO.

According to data signal DI provided from the outside, write circuit 12 changes one of data input/output lines IO, /IO to "H" level, and simultaneously, changes the other data input/output lines IO, /IO to "L" level and writes data signal DI into memory cell 2. As word line W0 and column select line CSL rises to "L" level, data signal DI is stored in memory cell 2.

Figure 3:
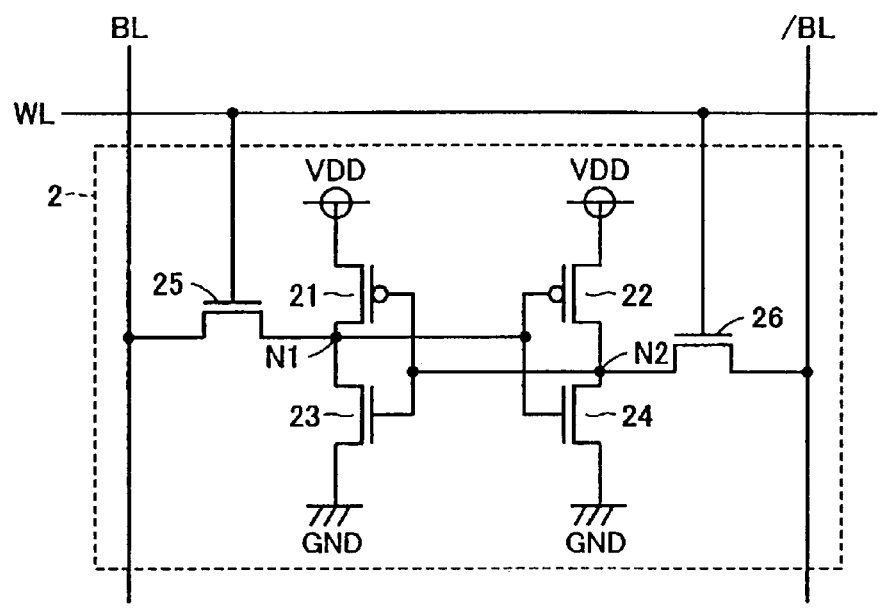
FIG. 3 is a circuit diagram showing configuration of the memory cell shown in FIG. 1.

FIG. 3 is a circuit diagram showing configuration of memory cell 2. In FIG. 3, the memory cell MC includes a load transistors (P-channel MOS transistors 21, 22), driver transistors (N-channel MOS transistors 23, 24) and access transistors (N-Channel MOS transistors 25, 26). P-channel MOS transistors 21, 22 are respectively connected between a line of power supply potential VDD and memory nodes N1, N2, with their gates respectively connected to nodes N2, N1. N-channel MOS transistors 23, 24 are respectively connected between memory nodes N1, N2 and a line of ground potential GND, with their gates respectively connected to nodes N2, N1. N-channel MOS transistors 25, 26 are respectively connected between memory nodes N1, N2 and bit lines BL, IBL, with their gates both connected to word line WL.

In write operation, in response to write data signal DI, one of bit lines BL, /BL is changed to "H" level, while the other is changed to "L" level. Next, word line WL is changed to the select level of "H" to render N-channel MOS transistors 25, 26 conductive, and level of bit lines BL, /BL are respectively applied to memory nodes N1, N2. When memory nodes N1, N2 are respectively provided with "H" level and "L" level, MOS transistors 21, 24 are rendered conductive and MOS transistors 22, 23 are rendered non-conductive, while the level of memory nodes N1, N2 are latched by MOS transistors 21 to 24. Additionally, when memory nodes N1, N2 are respectively provided with "L" level and "H" level, MOS transistors 22, 23 are rendered conductive and MOS transistors 21, 24 are rendered non-conductive, while the levels of memory nodes N1, N2 are latched by MOS transistors 21 to 24. When word line WL is changed to "L" level of the non-select level, N-channel MOS transistors 25, 26 are rendered non-conductive and levels of memory nodes N1 and N2 are maintained.

In read operation, each bit line BL, /BL is charged to "H" level by precharge circuit 4 shown in FIG. 1. When word line WL is changed to the select level of "H", N-channel MOS transistors 25, 26 are rendered conductive. If memory nodes N1 and N2 are respectively latched with "H" level and "L" level, then current flows from bit line /BL to a line of ground potential GND via N-channel MOS transistors 26, 24, and bit lines BL, /BL are respectively changed to "H" level and "C" level. If memory nodes N1 and N2 are respectively latched with "L" level and "H" level, then current flows from bit line BL to a line of ground potential GND via N-channel MOS transistors 25, 23, and bit lines BL, /BL are respectively changed to "L" level and "H" level. By comparing levels of bit lines BL, /BL, memory data of memory cell 2 is read. When word line WL is changed to the non-select level of "L", N-channel transistors 25, 26 are rendered non-conductive and thus data reading ends.

Figure 4A:
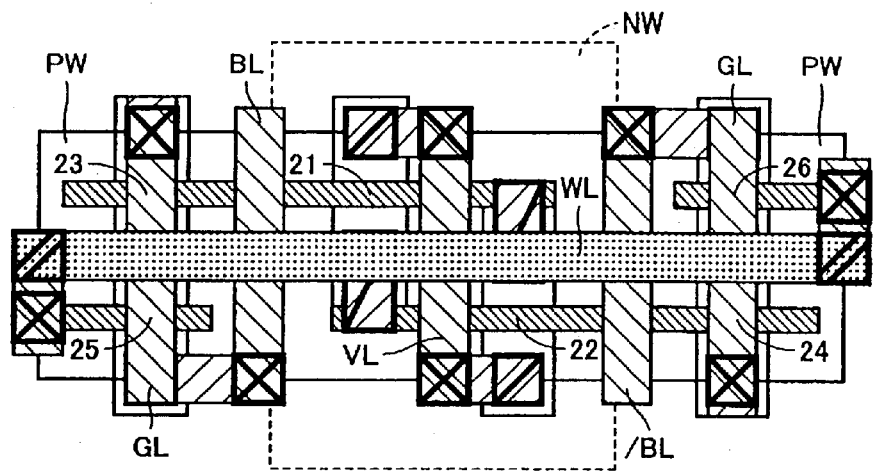
FIGS. 4A to 4C illustrate layout of the memory cell shown in FIG. 3.
Figure 4B:
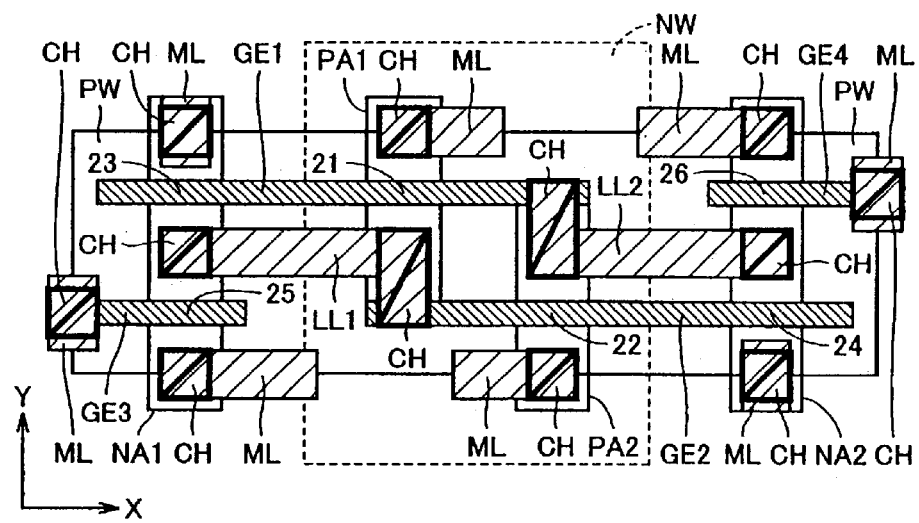
Figure 4C:
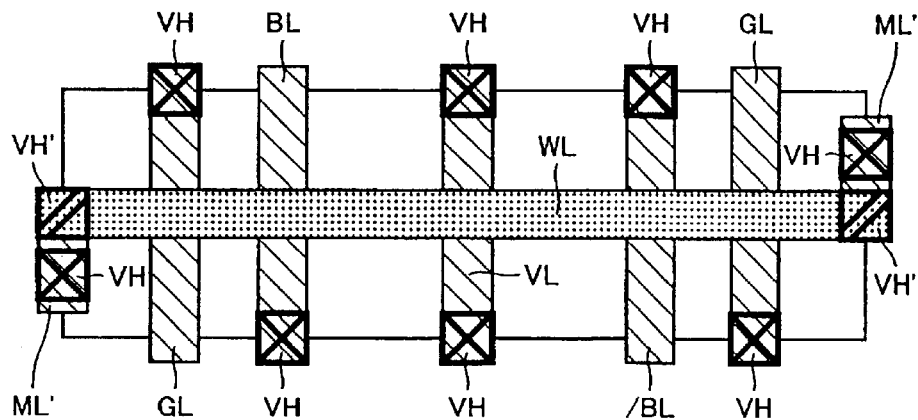

FIG. 4A illustrates layout of memory cell 2, and FIGS. 4B and 4C are illustration for supplemental explanation thereof. In FIG. 4B, the memory cell 2 is so-called laterally extending memory cell, which is formed on the surface of one N-type well NW and P-type well PW, PW provided at both sides of N-type well NW. First, a gate electrode GE1 extending from N-type well NW over one P-type well PW in X direction a gate electrode GE2 extending from N-type well NW over the other P-type well PW in X direction, a gate electrode GE3 extending over one P-type well PW in X direction, and a gate electrode GE4 extending over the other P-type well PW in X direction, are formed by polysilicon layer.

Next, an N-type active layer NA1 is formed in one P-type well PW so as to cross gate electrodes GE1, GE3, an N-type active layer NA2 is formed in the other P-type well PW so as to cross gate electrodes GE2, GE4, and P-type type active layers PA1, PA2 are formed in N-type well NW so as to respectively cross gate electrodes GE1, GE2.

Gate electrode GE1 and P-type active layer PA1, and gate electrode GE2 and P-type active layer PA2, respectively form P-channel MOS transistors 21, 22. Gate electrode GE1 and N-type active layer NA1, and gate electrode GE3 and N-type active layer NA1, respectively form N-channel MOS transistors 23, 25. Gate electrode GE2 and N-type active layer NA2, and gate electrode GE4 and N-type active layer NA2, respectively form N-channel MOS transistors 24, 26.

Next, a local interconnection LL1 is formed by a first metal interconnection over the middle portion of N-type active layer NA1, one end of P-type active layer PA1 and one end of gate electrode GE2, while a local interconnection LL2 is formed by a first aluminum interconnection over the middle portion of N-type active layer NA2, one end of P-type active layer PA1 and one end of gate electrode GE2. One end of local interconnection LL1, P-type active layer PA1 and gate electrode GE2 are connected together via contact hole CH. One end of local interconnection LL2, P-type active layer PA2 and gate electrode GE1 are connected together via contact hole CH. The other end of local interconnection LL1 and N-type active layer NA1, and the other end of local interconnection LL2 and N-type active layer NA2, are respectively connected to each other via contact holes CH, CH.

Further, a plurality of metal interconnection ML extending in X direction in the figure is formed by the first metal interconnection layer, and as shown in FIG. 4C, thereabove, metal interconnection ML', ground interconnection GL, bit line BL, power-supply interconnection VL, bit line /BL, ground interconnection GL, and metal interconnection ML' extending in Y direction in the figure are formed by a second metal interconnection layer, and, thereabove, word line WL crossing the middle portion of memory cell 2 in Y direction is formed by a third metal interconnection layer. Power-supply interconnection VL is provided with power-supply potential VDD and ground interconnection GL is provided with ground potential GND.

One end of P-type active layer PA1 (source of P-channel MOS transistor 21) is connected to power-supply interconnection VL via contact hole CH, metal interconnection ML and via hole VH. One end of P-type active layer PA2 (source of P-channel MOS transistor 22) is connected to power-supply interconnection VL via contact hole CH, metal interconnection ML and via hole VH.

One end of N-type active layer NA1 (source of N-channel MOS transistor 23) is connected to ground interconnection GL via contact hole CH, metal interconnection ML and via hole VH. One end of N-type active layer NA2 (source of N-channel MOS transistor 24) is connected to ground interconnection GL via contact hole CH, metal interconnection ML and via hole VH.

The other end of N-type active layer NA1 (drain of N-channel MOS transistor 25) is connected to bit line BL via contact hole CH, metal interconnection ML and via hole VH. The other end of N-type active layer NA2 (drain of N-channel MOS transistor 26) is connected to bit line /BL via contact hole CH, metal interconnection ML and via hole VH. Each of gate electrodes GE3, GE4 is connected to word line WL via contact hole CH, metal interconnection ML, via hole VH, metal interconnection ML', and via hole VH'.

Figure 5:
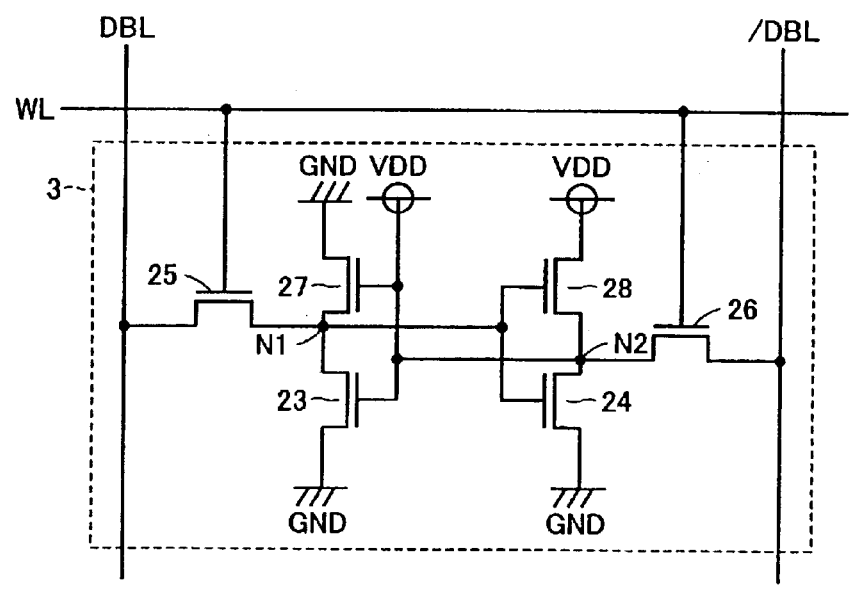
FIG. 5 illustrates configuration of the dummy memory cell shown in FIG. 5.

FIG. 5 is a circuit diagram showing configuration of dummy memory cell 3, to be compared with FIG. 3. Referring to FIG. 5, dummy memory cell 3 is different from memory cell 2 in FIG. 3 in that P-channel MOS transistors 21, 22 are respectively replaced by N-channel MOS transistors 27, 28. N-channel MOS transistor 27 is connected between a line of ground potential GND and memory node N1, and has its gate connected to a line of power-supply potential VDD and memory node N2. N-channel MOS transistor 28 is connected between a line of power-supply potential VDD and memory node N2, and has its gate connected to memory node N1. N-channel MOS transistors 25, 26 have their drain respectively connected to dummy bit lines DBL, /DBL.

Next, the operation of dummy memory cell 3 will be described. In the initial state, the word line WL is at "L" level, N-channel MOS transistors 25, 26 are in non-conductive states, and dummy bit lines DBL, /DBL are prechaxged to "H" level. N-channel MOS transistors 23, 27 are normally on, N-channel MOS transistors 24, 28 are normally off, and memory node N2 is at "H" level.

As the read operation is initiated, word line WL specified by the row address signal is changed from "L" level to "H" level to render N-channel MOS transistors 25, 26 conductive. Thus, current flows from dummy bit line DBL to a line of ground potential GND via N-channel transistors 25, 23, 27, and potential of dummy bit line DBL gradually decreases from "H" level to ground potential GND. At this time, dummy bit line DBL is discharged via two N-channel MOS transistors 23, 27 connected in parallel, while bit line BL or /BL is discharged via one N-channel MOS transistor 23 or 24 as shown in FIG. 3, and thus the speed of potential decrease of dummy bit line DBL is faster than that of but line BL or /BL. Since N-channel MOS transistors 24, 28 are fixed at non-conductive state, potential of dummy bit line /DBL will be maintained at precharge potential even when N-channel MOS transistor 26 is rendered conductive.

As the change of dummy bit line DBL, going to "L" level from "H" level, is sensed by inverter 9 of FIG. 1, word line WL falls to the non-select level of "L" level to render N-channel MOS transistors 25, 26 non-conductive, and dummy bit line DBL and a line of ground potential GND is electrically disconnected. Thereafter, dummy bit lines DBL, /DBL are precharged to "H" level for the next read operation.

Figure 6A:
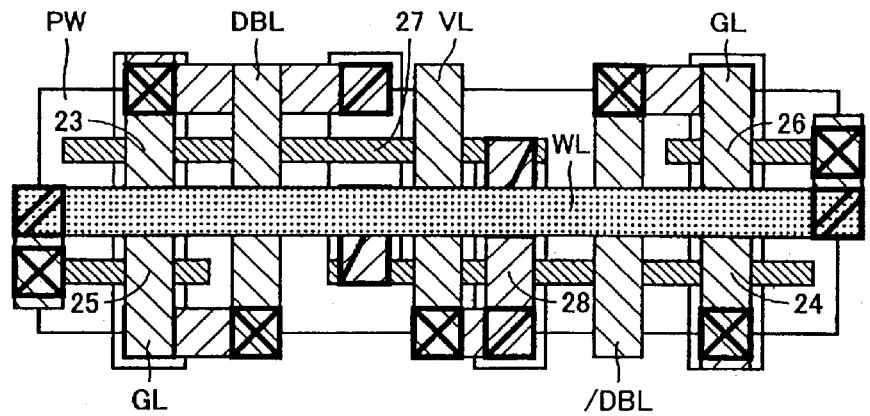
FIGS. 6A to 6C illustrate layout of the dummy memory cell shown in FIG. 5.
Figure 6B:
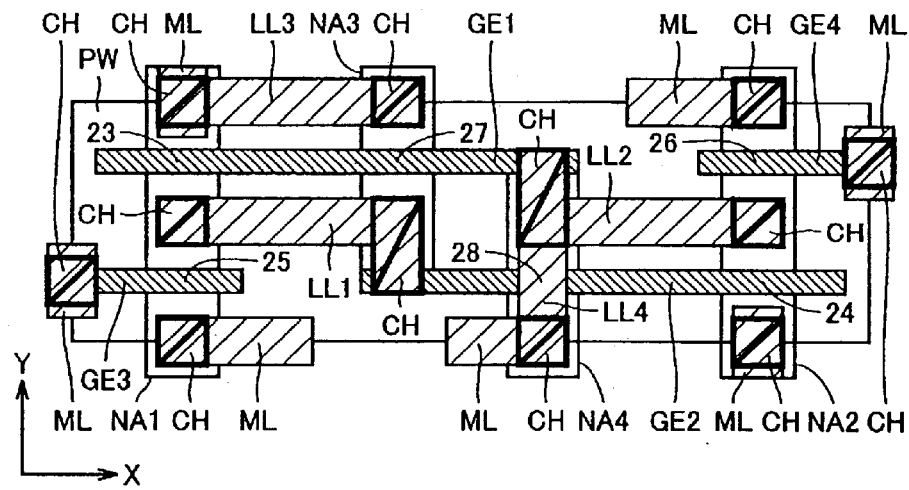
Figure 6C:
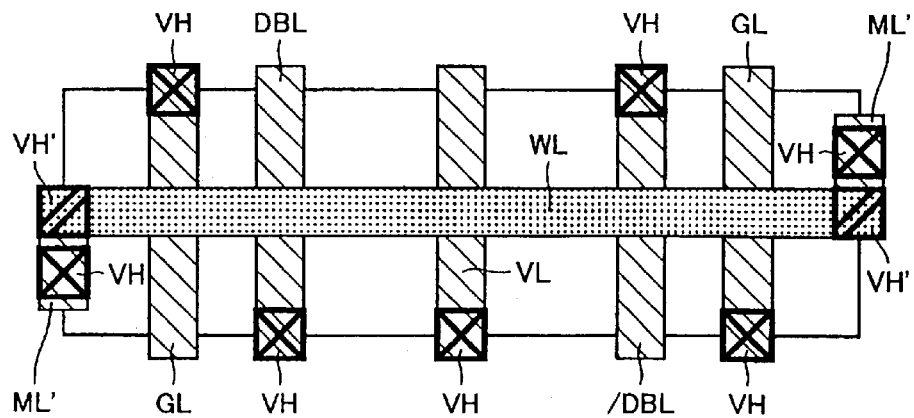

FIGS. 6A to 6C show layout of dummy memory cell 3, to be compared with FIGS. 4A to 4C. Referring to FIGS. 6A to GC, the layout of dummy memory cell 3 is different from that of memory cell 2 in three aspects. The first modification is that N-type well is removed and P-type active layers PA1, PA2 are respectively replaced by N-type active layers NA3, NA4, and P-channel MOS transistors 21, 22 are replaced by N-channel MOS transistors 27, 28. The second modification is that metal interconnection ML and via hole VH are replaced by local interconnection LL3 formed by first metal interconnection layer, N-channel MOS transistor 27 has its source connected to ground interconnection GL via contact hole CH, local interconnection LL3, metal interconnection ML, and via hole VH. The third modification is that a local interconnection LL4 forked by first metal interconnection layer is added, N-channel MOS transistors 23, 27 have their gate electrode GE1 connected to power-supply interconnection VL via contact hole CH, local interconnection LL4, metal interconnection ML and via hole. Therefore, in the layout of dummy memory cell 3, the shape of well, first metal interconnection layer and via hole VH is different from that of memory cell 2, but the shape of gate electrode GE and active layer is the same as memory cell 2.

In the first embodiment, as word line WL rises to "H" level, current flows from dummy bit line DBL to a line of ground potential GND via N-channel MOS transistors 25, 23 and 27, and current flows from bit line BL or /BL to a line of ground potential GND via N-channel MOS transistors 25, 23 or 26, 24. Therefore, the speed of potential decrease of dummy bit line DBL is faster than that of bit line BL or /BL, thus the timing of activating the sense amplifier in read circuit 13 can easily be optimized. Further, the timing of changing word line WL to "L" level may also be optimized easily, thus wasteful power dissipation due to discharge of bit lines BL, /BL can be reduced.

Additionally, in dummy memory cell 3, since charges stored in memory node N1, connected to dummy bit line DBL by N-channel MOS transistor 25, are drawn by two N-channel MOS transistors 23, 27 connected in parallel, even when the characteristics of N-channel MOS transistors 23, 27 vary, it is possible to average the variations, and thus variation in characteristics may be reduced. Thus, high operational margin can be attained.

Further, the layout area need not be significantly increased, since there is no need to provide a plurality of dummy memory cell columns.

Still further, since the number of interconnections in dummy memory cell 3 and in memory cell 2 are the same, and the number per column of dummy memory cell 3 and memory cell 2 are the same, parasitic capacitance of dummy bit line DBL and that of bit line BL or /BL can be matched. Still further, the layout form of gate electrode and active layer of dummy memory cell 3 are the same as that of memory cell 2, thus the characteristics of transistors in dummy memory cell 3 can easily be matched with that of memory cell 2. Accordingly, the operational timing can easily be adjusted and increased margin can be attained.

In the following, variations of the first embodiment will be described. Dummy memory cell 30 in FIG. 7 corresponds to N-channel MOS transistor 28 of dummy memory cell 3 in FIG. 5, with its source changed to be connected to a line of ground potential. FIGS. 8A to 8C illustrate layout of dummy memory cell 30. The layout of dummy memory cell 30 is different from that of dummy memory cell 3 in FIGS. 6A to 6C in that: (1) local interconnection LL4 and metal interconnection ML are replaced by local interconnection LL5, N-channel MOS transistor 28 has its source connected to ground interconnection GL via contact hole CH, local interconnection LL5 and via hole VH; and (2) one end of local interconnection LL2' extends under power-supply interconnection VL, and N-channel MOS transistors 23, 27 have their gate electrode GE1 connected to power-supply interconnection VL via contact hole CH, local interconnection LL2', and via hole VH. According to this variation, the same effect as the first embodiment can be attained.

Figure 7:
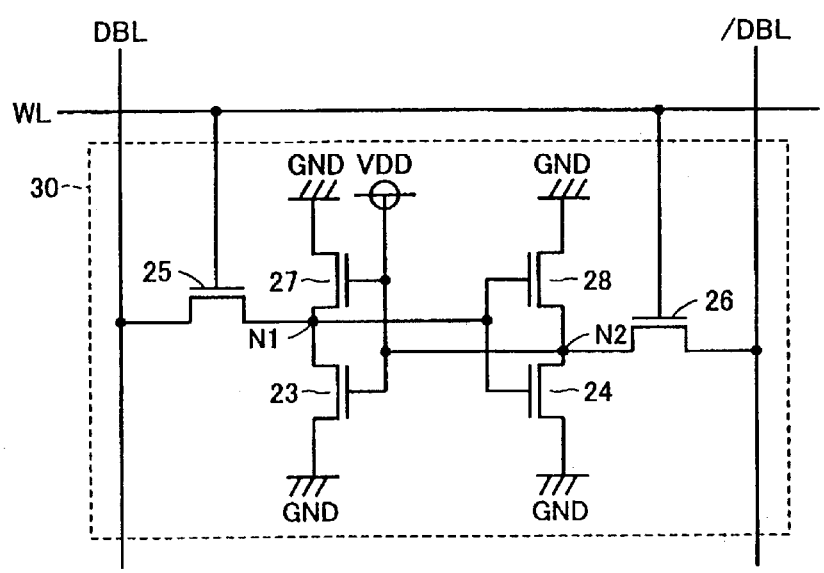
FIG. 7 shows a variation of the first embodiment.
Figure 8A:
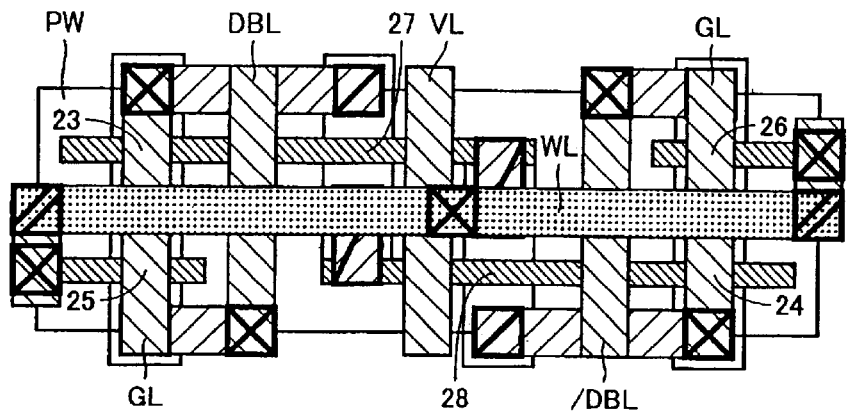
FIGS. 8A to 8C illustrate layout of the dummy memory cell shown in FIG. 7
Figure 8B:
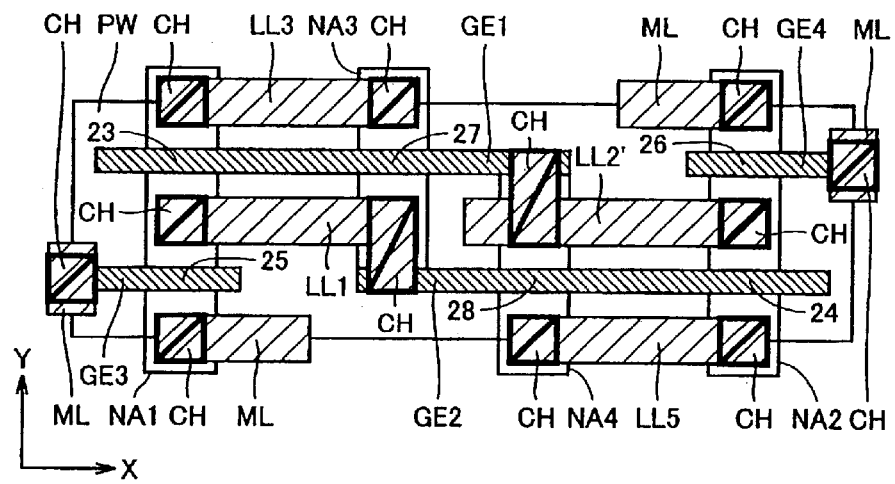
Figure 8C:
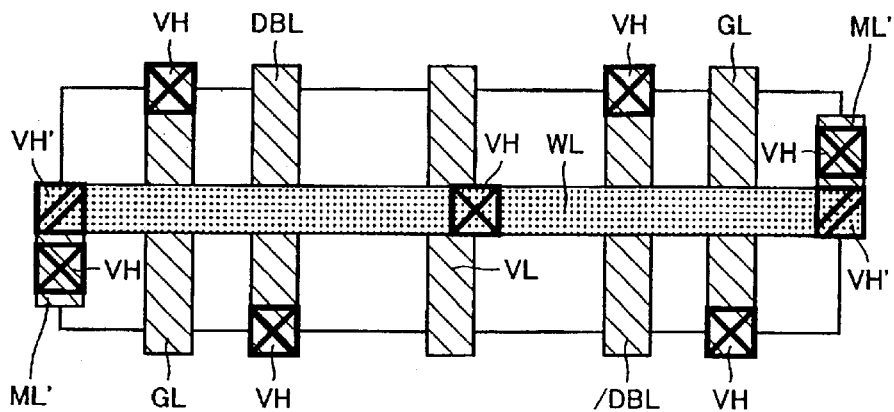
Figure 9:
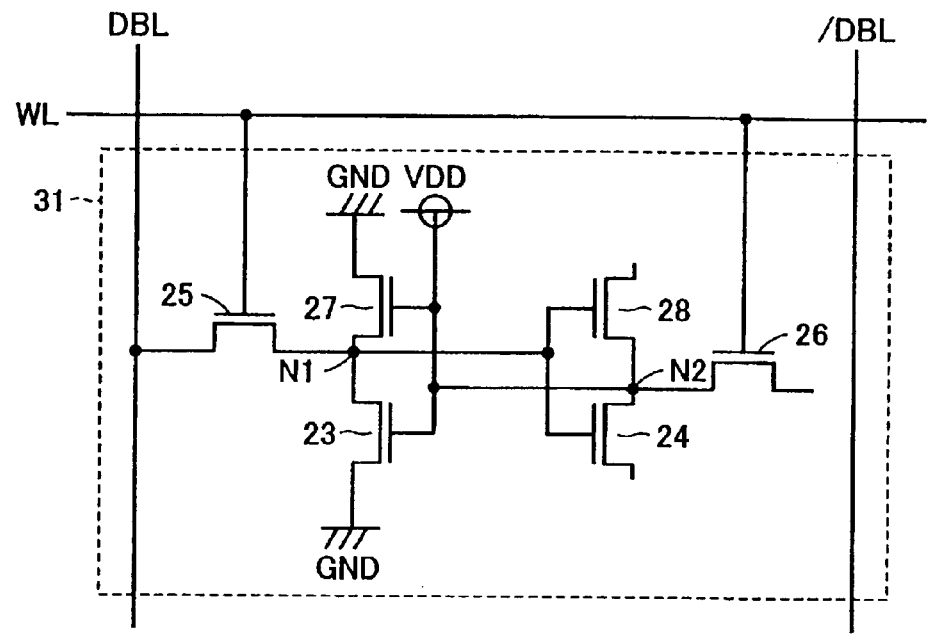
FIG. 9 is a circuit diagram showing another variation of the first embodiment.

Dummy memory cell 31 in FIG. 9 corresponds to dummy memory cell 30 in FIG. 7, with N-channel MOS transistors 24, 28 having their source in floating states and N-channel MOS transistor 26 having its drain in floating state. Specifically, since N-channel MOS transistors 24, 28 are normally kept non-conductive state, the same results can be obtained by applying either potential of power-supply potential VDD or ground potential GND to source of N-channel MOS transistors 24, 28, or by floating source of N-channel MOS transistors 24, 28. Additionally, since no current flows through N-channel MOS transistor 26, the same results can be obtained when connecting or disconnecting drain of N-channel MOS transistor 26 and dummy bit line /DBL.

Figure 10:
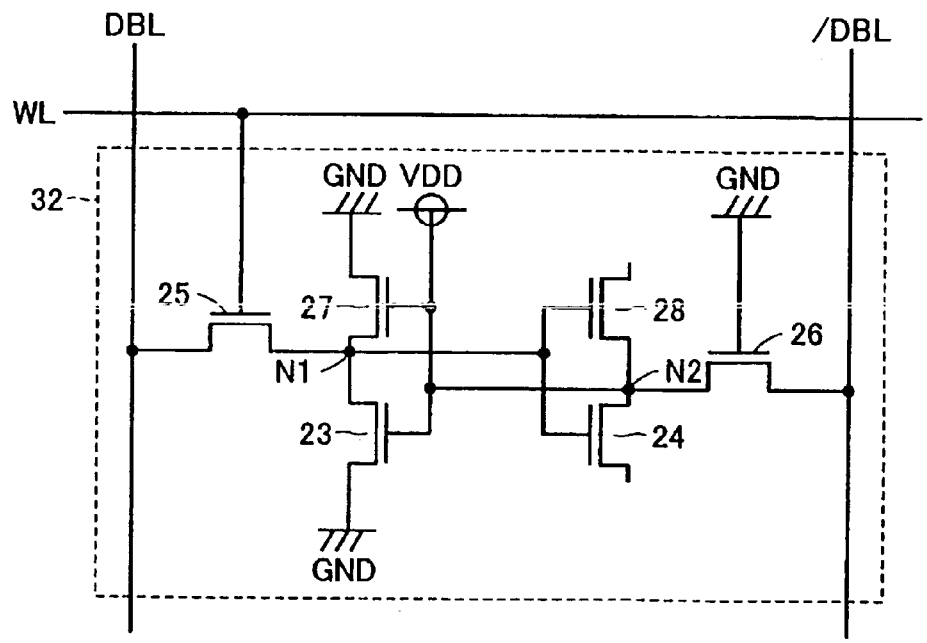
FIG. 10 is a circuit diagram showing still another variation of the first embodiment.

Dummy memory cell 32 of FIG. 10 corresponds to dummy memory cell 31 of FIG. 9, with N-channel MOS transistor 26 having their drain connected to dummy bit line /DBL and N-channel MOS transistor 26 having its gate connected to a line of ground potential GND. Specifically, since N-channel MOS transistor 26 does not pass current, the same results can be obtained, when connecting gate of N-channel MOS transistor 26 to word line WL, or when connecting gate of N-channel MOS transistor 26 to a line of ground potential GND to maintain N-channel MOS transistor 26 normally non-conductive.

Figure 11:
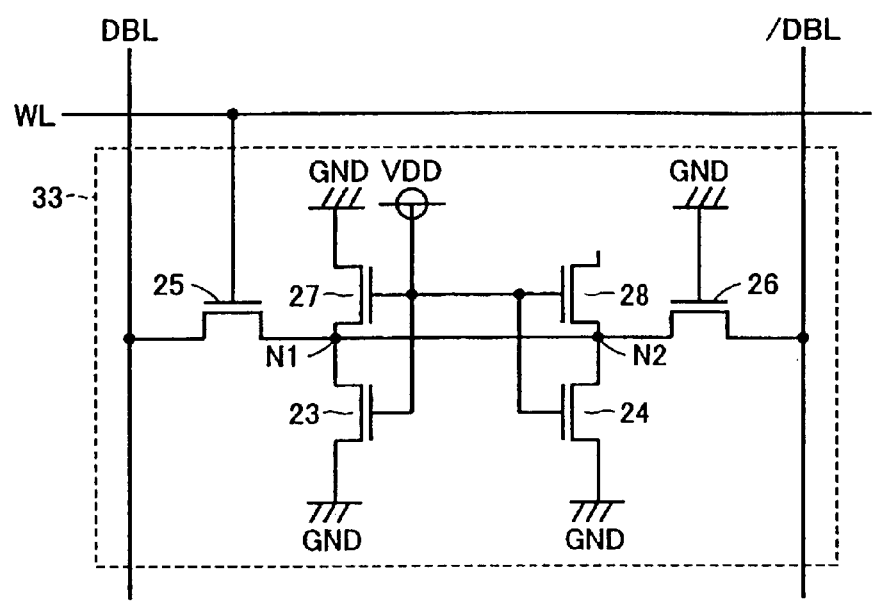
FIG. 11 is a circuit diagram showing still another variation of the first embodiment.
Figure 12A:
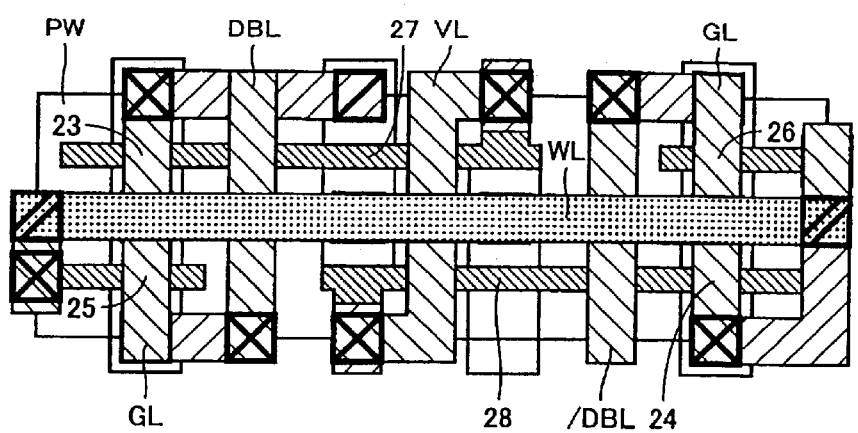
FIGS. 12A to 12C illustrate layout of dummy memory cell shown in FIG. 11.
Figure 12B:
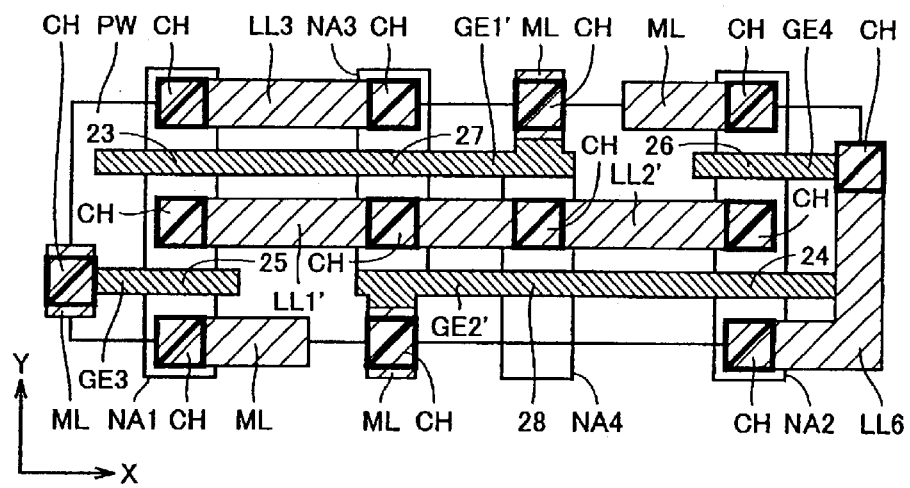
Figure 12C:
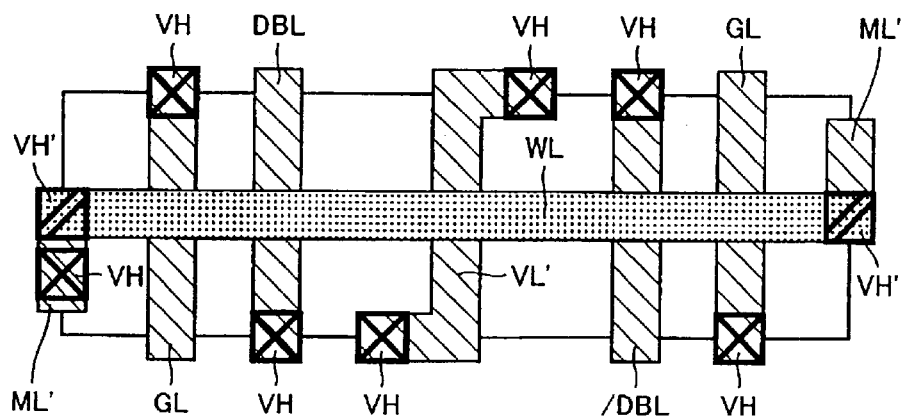

Dummy memory cell 33 of FIG. 11 corresponds to dummy memory cell 30 of FIG. 7, with N-channel MOS transistors 24, 28 having their gates connected to gates of N-channel MOS transistors 23, 27, connecting memory nodes N1 and N2, floating source of N-channel MOS transistor 28, and N-channel MOS transistor 26 having its gate connected to a line of ground potential GND. FIGS. 12A to 12C illustrate layout of dummy memory cell 33. The layout of dummy memory cell 33 is different from that of FIGS. 8A to 8C in the following five aspects.

The first modification is that one end of gate electrode GE1 extends in Y direction in the figure to be an electrode GE1', and this gate electrode GE1' is connected to power-supply interconnection VL' via contact hole CH, metal interconnection ML and via hole VH. The second modification is that one end of gate electrode GE2 extends in Y direction in the figure to be an electrode GE2', and this gate electrode GE2' is connected to power-supply interconnection VL' via contact hole CH, metal interconnection ML and via hole VH.

The third modification is that local interconnection LL1 extends in X direction in the figure to connect to local interconnection LL2', and memory nodes N1 and N2 are connected. The fourth modification is that local interconnection LL5 and contact hole CH is removed and source of N-channel MOS transistor 28 is in floating state. The fifth modification is that local interconnection LL6 is added and gate electrode GE4 of N-channel MOS transistor 26 is connected to ground interconnection GL via contact hole CH, local interconnection LL6, and via hole VH. In this variation example, since dummy bit line DBL falls to ground potential GND via three N-channel MOS transistors 23, 24 and 27 when word line WL rises to "H" level, the speed of potential decrease of dummy bit line DBL will be faster than that of dummy memory cells 3, 30 to 32 in which dummy bit line DBL falls to ground potential GND via two N-channel MOS transistors 23, 27 connected in parallel.

Figure 13:
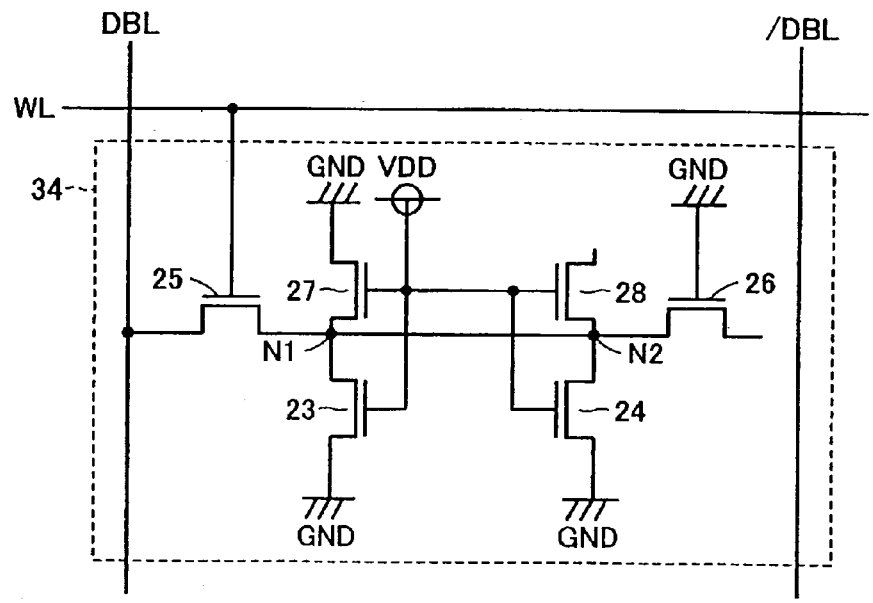
FIG. 13 is a circuit diagram showing still another variation of the first embodiment.

Dummy memory cell 34 in FIG. 13 corresponds to dummy memory cell 33 in FIG. 11, with a change of disconnecting drain of N-channel MOS transistor 26 and dummy bit line /DBL. Specifically, N-channel MOS transistor 26 is normally kept non-conductive, thus the same results can be obtained when connecting or disconnecting drain of N-channel MOS transistor 26 and dummy bit line /DBL.

Figure 14:
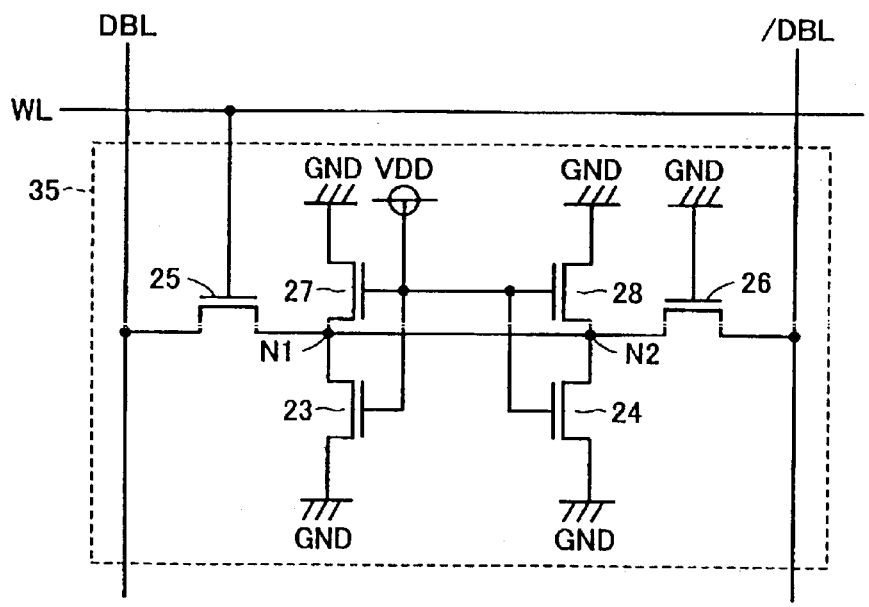
FIG. 14 is a circuit diagram showing still another variation of the first embodiment.
Figure 15A:
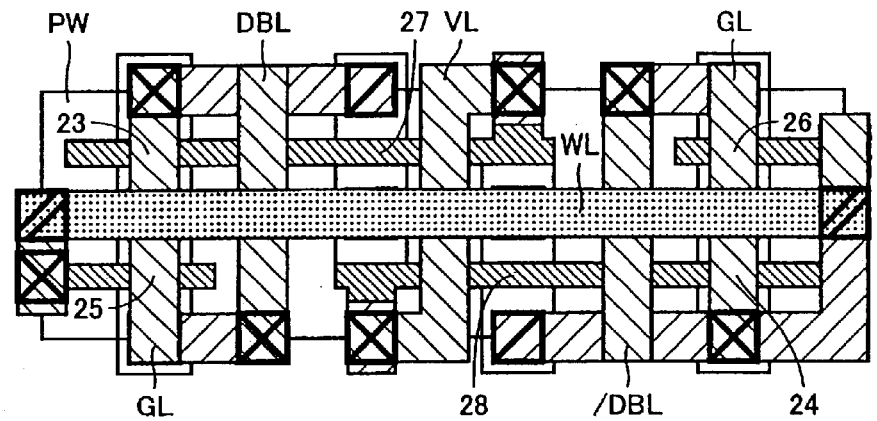
FIGS. 15A to 15C illustrate layout of dummy memory cell shown in FIG. 14.
Figure 15B:
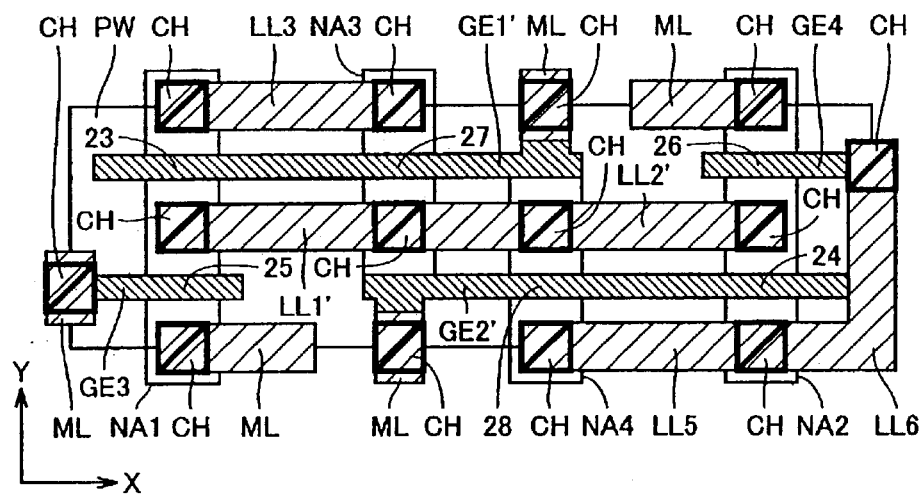
Figure 15C:
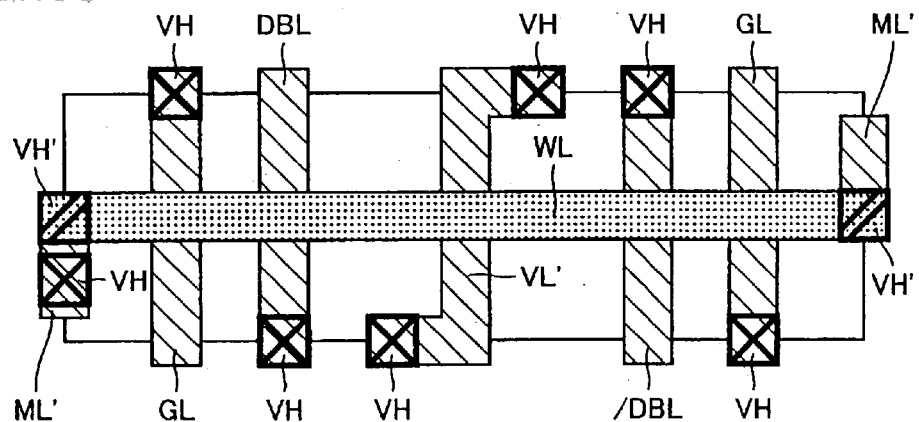

Dummy memory cell 35 in FIG. 14 corresponds to dummy memory cell 33 in FIG. 11, with a change of connecting source of N-channel MOS transistor 28 to line of ground potential GND. FIGS. 15A to 15C illustrate layout of dummy memory cell 35. The layout of dummy memory cell 35 is different from that of dummy memory cell 33 in FIGS. 12A to 12C in that contact hole CH and local interconnection LL5 are added, and source of N-channel MOS transistor 28 is connected to ground interconnection GL via contact hole CH, local interconnection 5 and via hole VH.

In this variation example, since dummy bit line DBL falls to ground potential GND via four N-channel MOS transistors 23, 24, 27 and 28 connected in parallel when word line WL rises to "H" level, speed of potential decrease of dummy bit line DBL will be faster than that of dummy memory cell 33, 34, in which dummy bit line DBL falls to ground potential GND via three N-channel MOS transistors 23, 24 and 27 connected in parallel.

Figure 16:
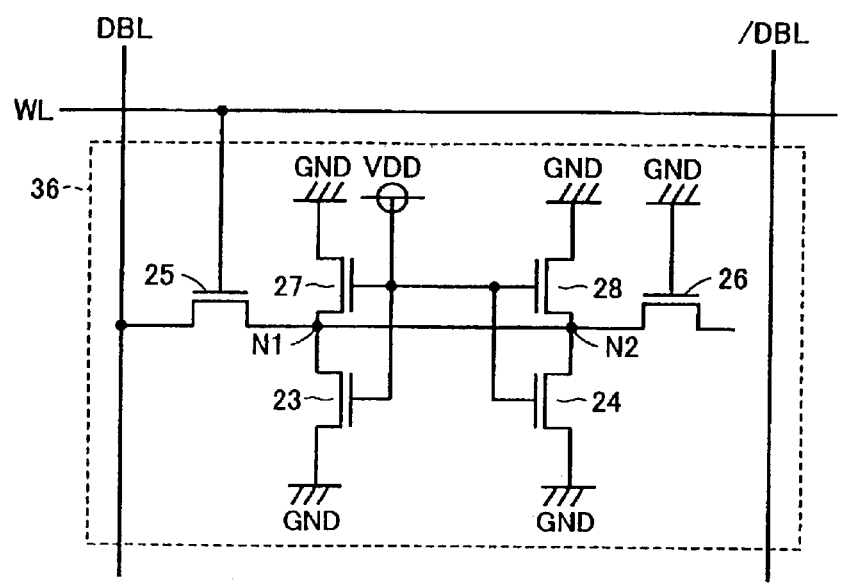
FIG. 16 is a circuit diagram showing still another variation of the first embodiment.

Dummy memory cell 36 in FIG. 16 corresponds to dummy memory cell 35 in FIG. 14, with a change of disconnecting drain of N-channel MOS transistor 26 from dummy bit line /DBL. Specifically, N-channel MOS transistor 26 is normally kept non-conductive, and thus the same results may be obtained when connecting or disconnecting drain of N-channel MOS transistor 26 and dummy bit line /DBL.

Figure 17:
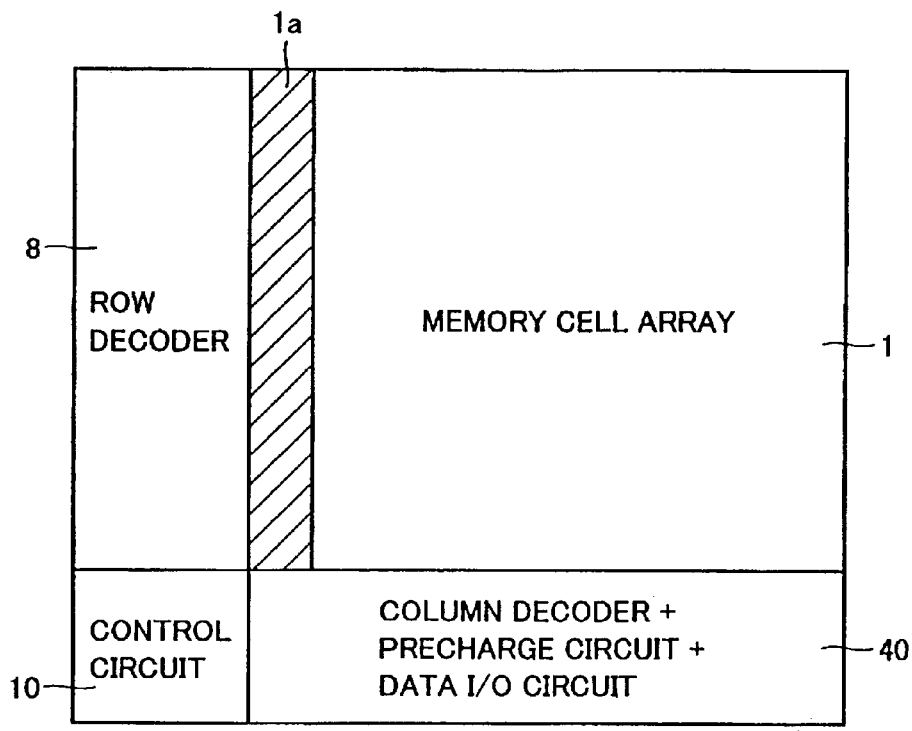
FIG. 17 is a block diagram illustrating layout of the SRAM shown in FIG. 1.
Figure 18:
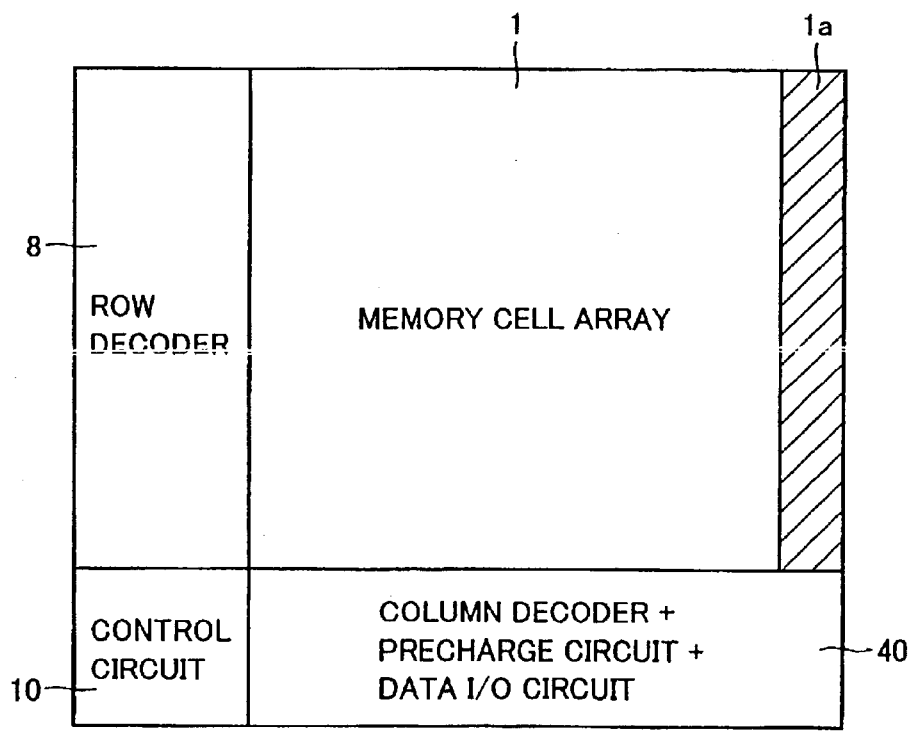
FIG. 18 is a block diagram showing still another variation of the first embodiment.

FIG. 17 is a block diagram illustrating layout of the SRAM shown in FIG. 1. In FIG. 17, dummy memory cell column 1a (hatched portion) is arranged at the edge of memory cell array 1 next to row decoder 8. Row decoder+ precharge circuit+data I/O circuit 40 includes precharge circuit 4, column selecting gate 6, inverter 9, column decoder 11, write circuit 12 and read circuit 13 as in FIG. 1. In an SRAM shown in FIG. 18, dummy memory cell column 1a is arranged at the edge of two memory cell array 1 Opposite to row decoder 8 of memory cell array 1.

Figure 19:
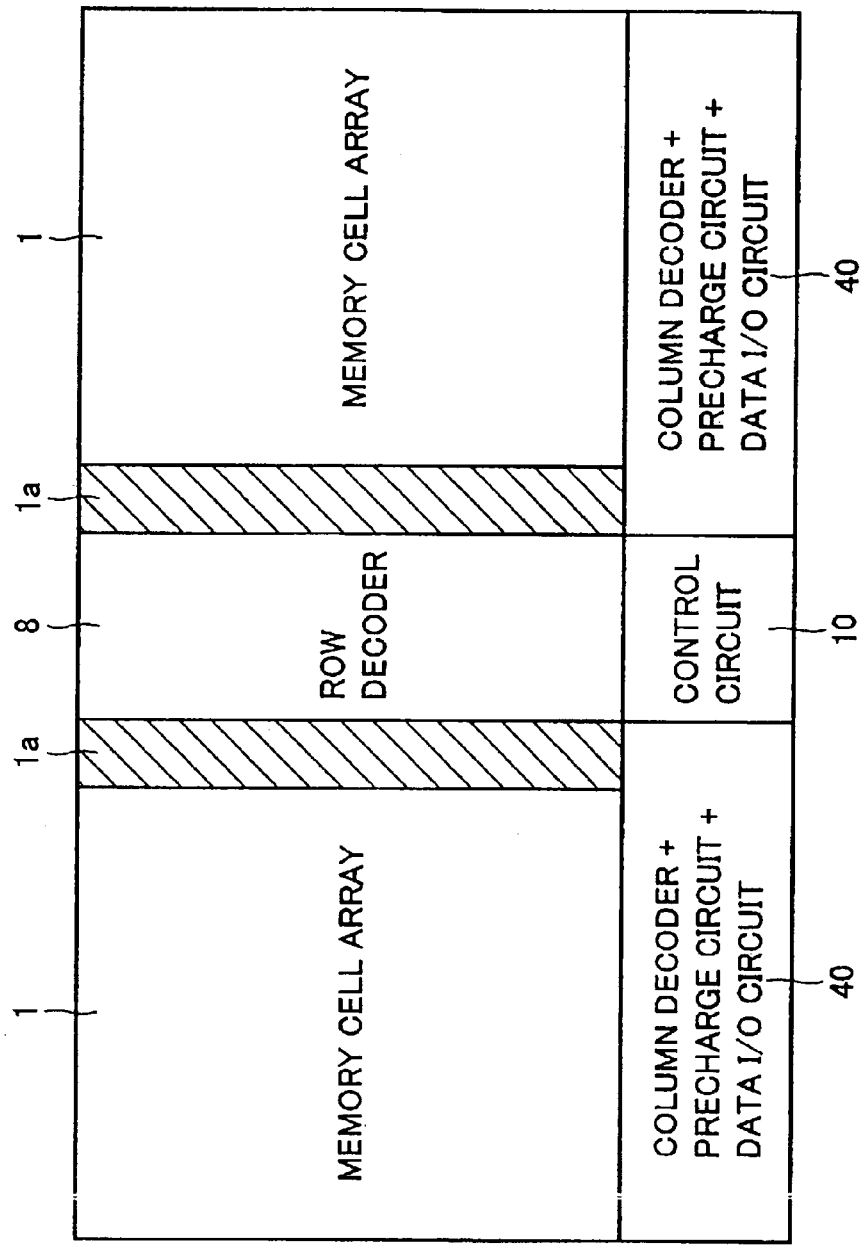
FIG. 19 is a block diagram showing still another variation of the first embodiment.

In an SRAM shown in FIG. 19, two sets of memory cell arrays 1, 1 are provided, with row decoder 8 arranged therebetween. Two dummy memory cell columns 1a, 1a are arranged at the edge of two memory cell arrays 1,1 next to row decoder 8, respectively. Two sets of column decoder+ precharge circuit+data I/O circuit 40 are respectively provided, corresponding to two sets of memory cell array 1, 1.

Figure 20:
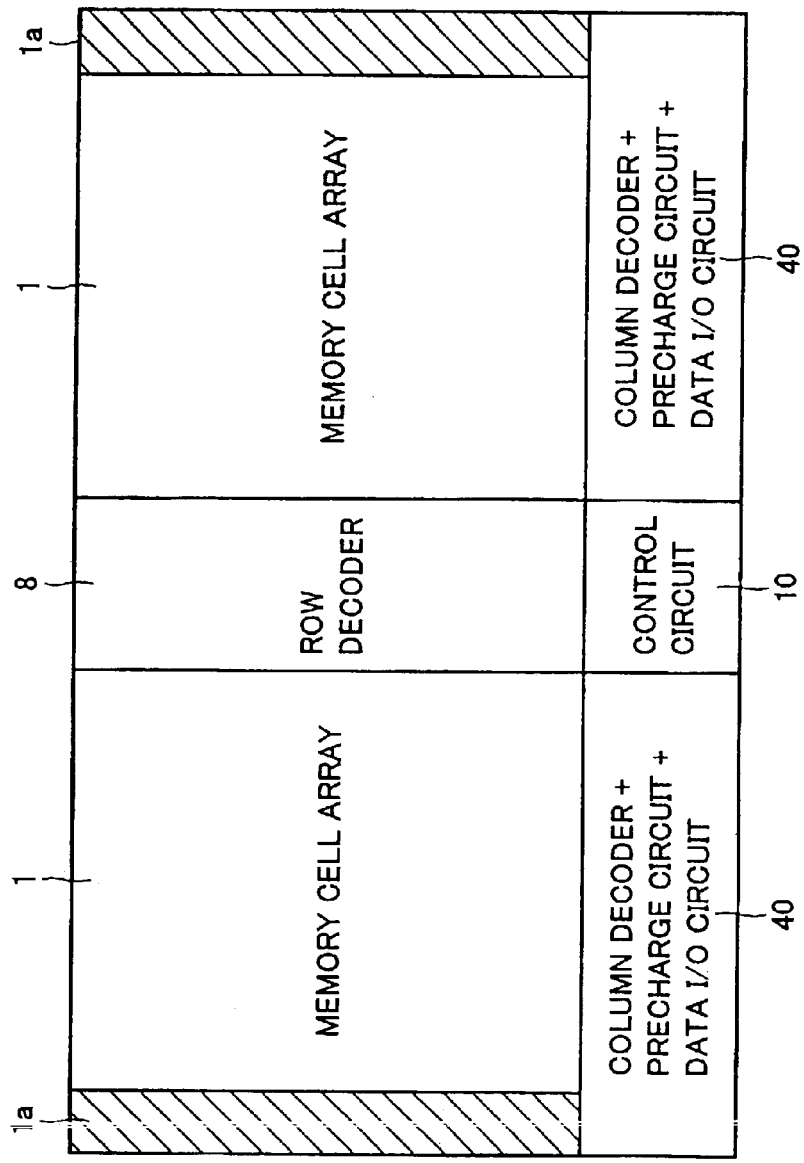
FIG. 20 is a block diagram showing still another variation of the first embodiment.

In FIG. 20, two sets of memory cell arrays 1, 1 are provided, with row decoder 8 arranged therebetween. Two dummy memory cell columns 1a, 1a are arranged at the edge of two memory cell arrays 1, 1 opposite to row decoder 8, respectively.

Figure 21:
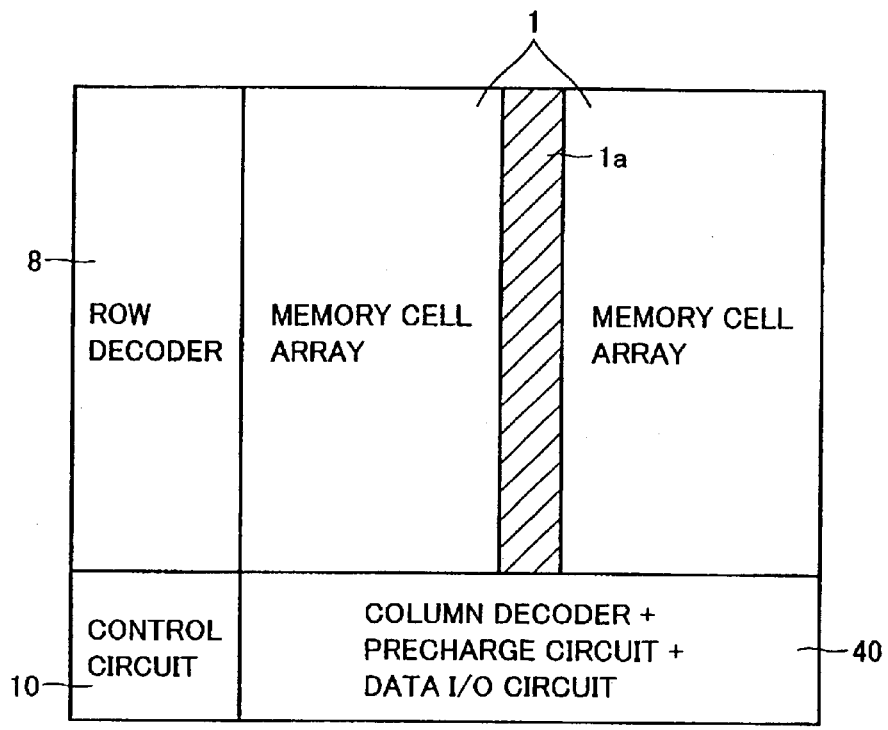
FIG. 21 is a block diagram showing still another variation of the first embodiment.
Figure 22:
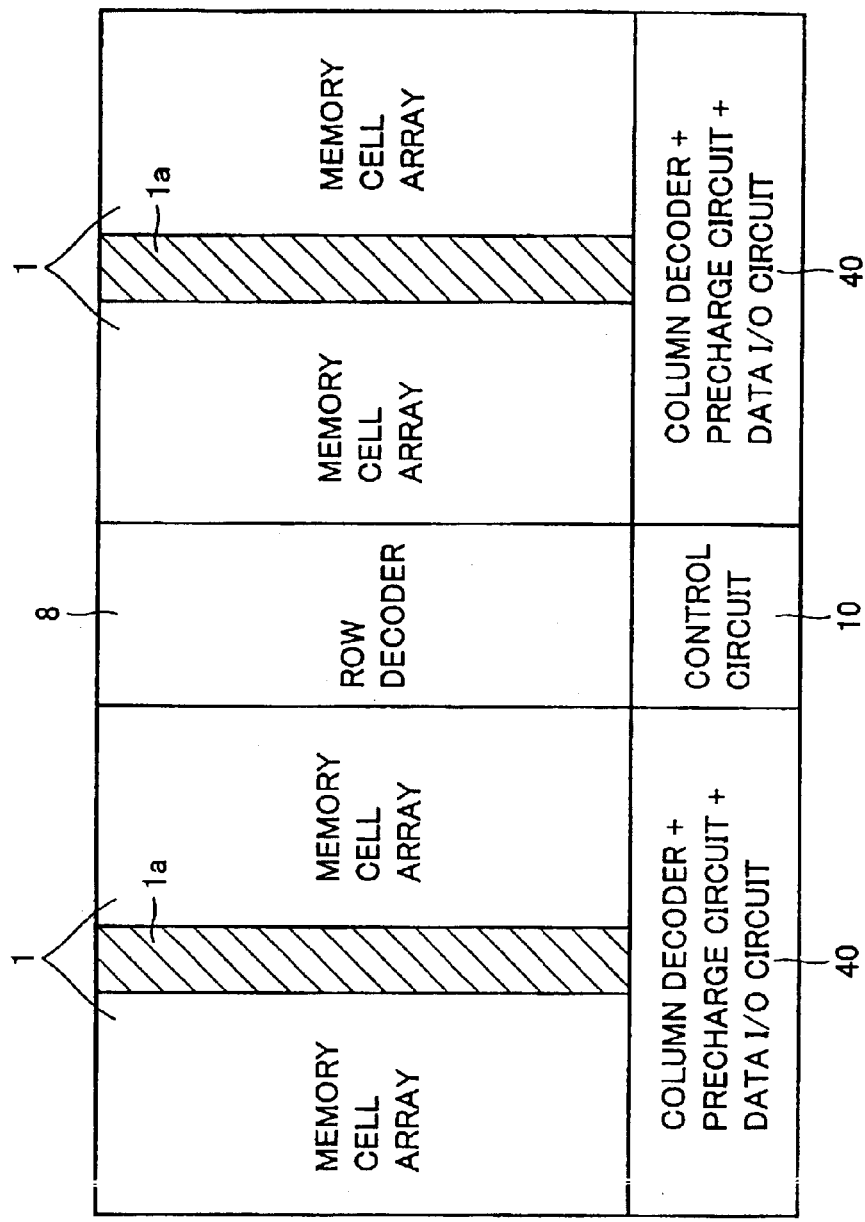
FIG. 22 is a block diagram showing still another variation of the first embodiment.

In an SRAM shown in FIG. 21, dummy memory cell column 1a is arranged at the middle portion of one memory cell array 1. In an SRAM shown in FIG. 22, two sets of memory cell array 1, 1 are provided, with dummy memory cell column 1a arranged at the middle portion of each memory cell array 1.

Dummy memory cells 3, 30 and 31 are applicable to any SRAM shown in FIGS. 17 to 22, without any limitation. It should be noted, however, that dummy cells 32 to 36 in FIGS. 10 to 16 must be provided with local interconnection LL6 for connecting gate of N-channel MOS transistor 26 to ground interconnection GL, and therefore even number of dummy memory cell columns must be provided when applied to SRAM of FIGS. 21 and 22.

Second Embodiment

Figure 23:
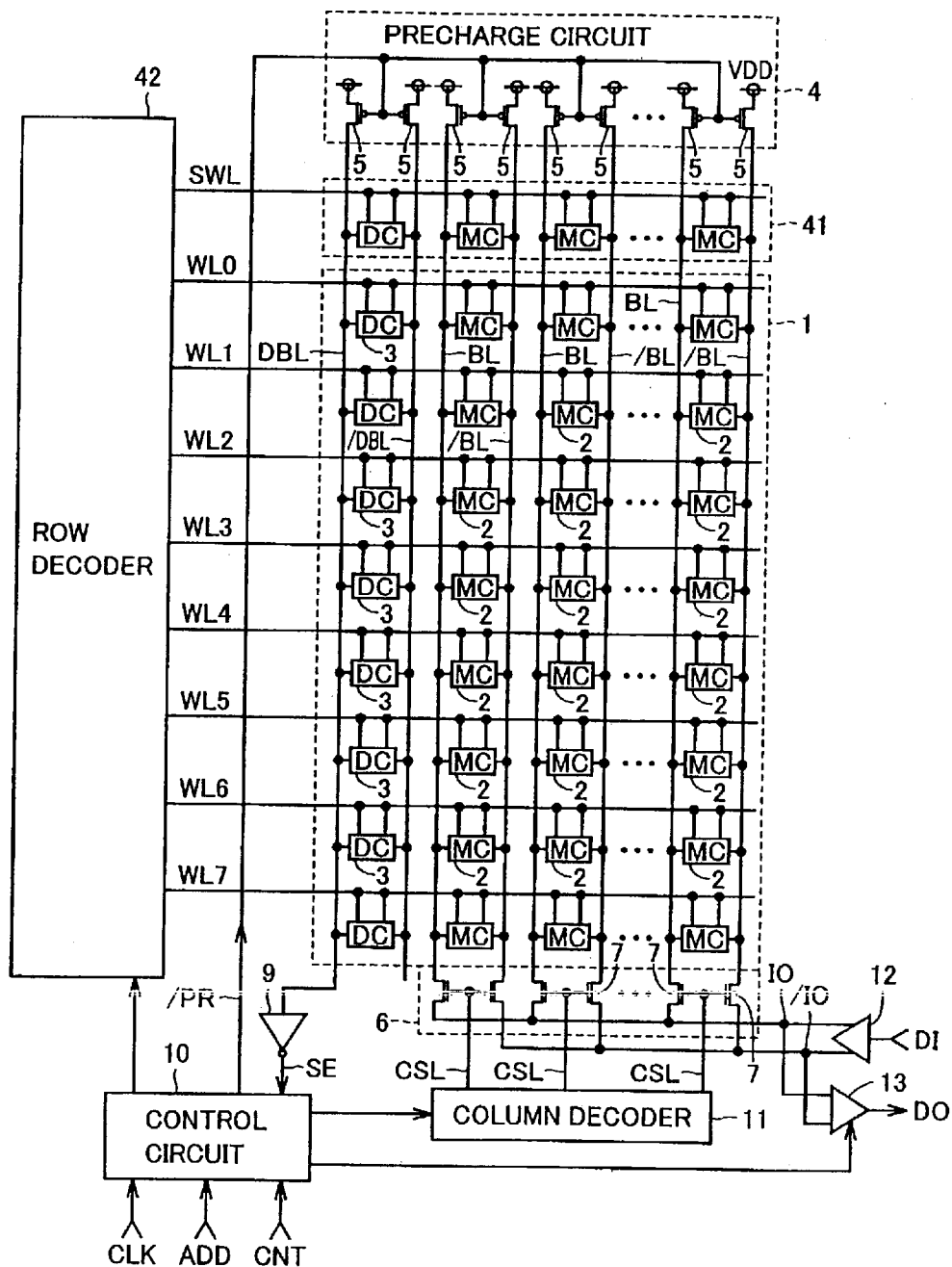
FIG. 23 is a circuit block diagram showing overall configuration of SRAM according to a second embodiment of the present invention.

FIG. 23 shows overall configuration of an SRAM according to a second embodiment of the present invention, and is to be compared with FIG. 1. Referring to FIG. 23, this SRAM is different from the SRAM in FIG. 1 in that redundant memory cell array 41 is added and row decoder 8 is replaced by column decoder 42.

Redundant memory cell 41 includes dummy memory cells 3 of at least one row (one row in the figure), a plurality of memory cells 2 and spare word line SWL. Row decoder 42 is provided with a program circuit for programming row address signal of defective memory row. For example, if at least one memory cell 2 of the first row is defective, then row address signal of the first memory cell row will be programmed. When row address signal of the first memory cell row is input, row decoder 42 raises spare word line SWL to the select level of "H", instead of word line WL0 of that row. Then, defective memory cell 2 will be replaced by spare memory cell 2.

According to the second embodiment, the same effect as the first embodiment can be attained, and further a defective memory cell row can be replaced by a normal spare memory cell row.

Third Embodiment

Figure 24:
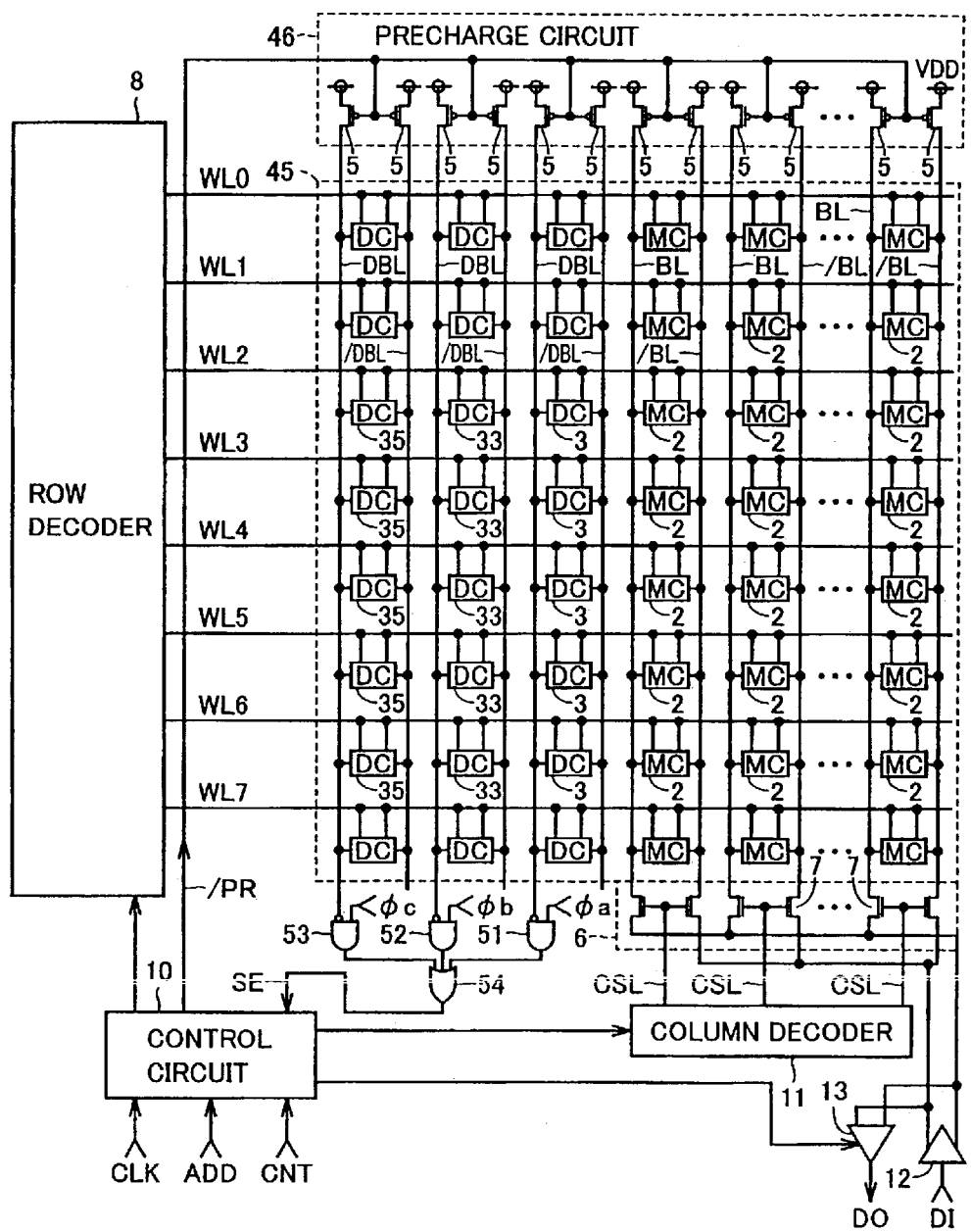
FIG. 24 is a circuit block diagram showing overall configuration of SRAM according to a third embodiment of the present invention.

FIG. 24 is a circuit block diagram showing overall configuration of an SRAM according to a third embodiment of the present invention, and is to be compared with FIG. 1. Referring to FIG. 24, this SRAM is different from that of FIG. 1 in that memory cell array 1 and precharge circuit 4 are respectively replaced by memory cell array 45 and precharge circuit 46, and gate circuits 51 to 53 and OR gate 54 are added.

Memory cell array 45 corresponds to memory cell array 1 at which edge two dummy memory cell columns are added. One of the additional dummy memory cell columns includes dummy bit line pair DBL, /DBL and eight dummy memory cells 33, and the other one of the additional dummy memory cell columns includes dummy bit line pair DBL, /DBL and eight dummy memory cells 35.

Precharge circuit 46 corresponds to precharge circuit 4 with four additional P-channel MOS transistors 5. Four P-channel MOS transistors 5 are respectively connected between one end of additional four dummy bit lines DBL, IDBL, DBL, and /DBL, and a line of power-supply potential VDD, and both of their gates receive precharge signal /PR.

One input node of gate circuit 51 is connected to the other end of dummy bit line DBL connected to dummy memory cell 3, while the other input node receives signal φa. One input node of gate circuit 52 is connected to the other end of dummy bit line DBL connected to dummy memory cell 33, while the other input node receives signal φb. One input node of gate circuit 53 is connected to the other end of dummy bit line DBL connected to dummy memory cell 35, while the other input node receives signal φc. OR gate 54 receives output signal of gate circuits 51 to 53 and its output signal is provided to circuit 10 as signal SE.

Each of the signals φa to φc is set at "H" or "L" level. Each of the signals φa to φc may be provided from an external source, or may be generated within an internal register, and the level may be selected by fuse or the like. For example, when only signal φa among signals φa to φc is set to "H" level, gate circuit 51 operates as an inverter and output signal of gate circuit 52, 53 are fixed at "L" level. In such a case, configuration is the same as that of SRAM of FIG. 1.

When only signal c among signals ha to φc is set to "H" level, gate circuit 53 operates as an inverter and output signal of gate circuit 51, 52 are fixed at "L" level. In this case, dummy bit line DBL is caused to fall to "L" level by four N-channel MOS transistors 23, 24, 27, and 28 of dummy memory cell 35 connected in parallel, and thus speed of potential decrease of dummy bit line DBL will be fast.

Therefore, by changing levels of signals φa to φc, the timing of changing level of signal SE can be changed even when transistor characteristics vary. Accordingly, operational margin can be increased and yield can be improved.

Figure 25:
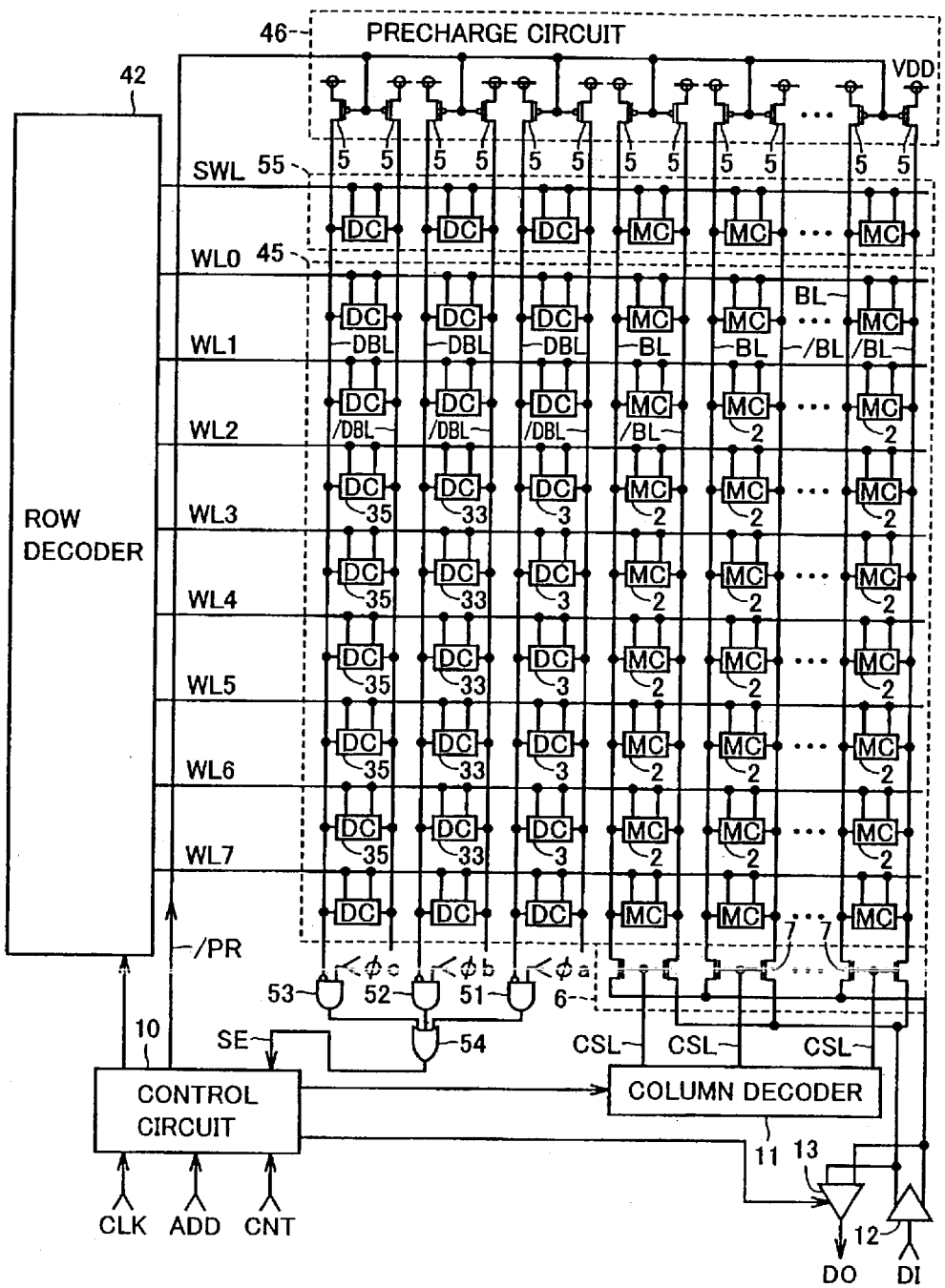
FIG. 25 is a circuit block diagram showing a variation of the third embodiment of the present invention.

An SRAM in FIG. 25 corresponds to the SRAM in FIG. 24 with additional redundant memory cell array 55. Redundant memory cell 55 includes dummy memory cells 3, 33, and 35 of at least one row (one row in the figure), a plurality of memory cells 2 and spare word line SWL. When row address signal corresponding to word line of defective row (e.g., WL0) is input, row decoder 42 changes spare word line SWL to the select level of "H", instead of word line WL0.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A static type semiconductor memory device, comprising:

a memory cell arranged at a crossing portion of a word line and first and second bit lines; and a dummy memory cell arranged at a crossing portion of said word line and first and second dummy bit lines; wherein said memory cell includes two P-channel MOS transistors for loading, two N-channel MOS transistors for driving, and two N-channel MOS transistors for accessing, and in response to corresponding word line being changed to a select level, lowers potential of one of said first and second bit lines precharged at power supply potential to ground potential via one N-channel MOS transistor for accessing and one N-channel MOS transistor for driving; and said dummy memory cell includes first and second N-channel MOS transistors provided corresponding to said two P-channel MOS transistors for loading, third and fourth N-channel MOS transistors provided corresponding to said two N-channel MOS transistors for driving, and fifth and sixth N-channel MOS transistors for accessing, and in response to said word line being changed to the select level, lowers potential of the first dummy bit line, of said first and second dummy bit lines precharged to said power supply potential, to said ground potential via said fifth N-channel MOS transistor and at least two of said first to fourth N-channel MOS transistors connected in parallel.

2. The static type semiconductor memory device according to claim 1, wherein said first and third N-channel MOS transistors are connected in parallel between a prescribed node and a line of said ground potential, with their gates receiving said power supply potential; and said fifth N-channel MOS transistor is connected between said first dummy bit line and said prescribed node, having its gate connected to said word line.

3. The static type semiconductor memory device according to claim 2, wherein said second and fourth N-channel MOS transistors have their gates both connected to said prescribed node; and said second, fourth and sixth N-channel MOS transistors have their first electrodes connected to the gates of said first and third N-channel MOS transistor.

4. The static type semiconductor memory device according to claim 2, wherein said second N-channel MOS transistor has its first electrode connected to said prescribed node, and its gate receiving said power supply potential, said fourth N-channel MOS transistor is connected between said prescribed node and the line of said ground potential, with its gate receiving said power supply potential, said sixth N-channel MOS transistor has its first electrode connected to said prescribed node, and its gate receiving said ground potential.

5. The static type semiconductor memory device according to claim 4, wherein said second electrode of second N-channel MOS transistor receives said ground potential.

6. The static type semiconductor memory device according to claim 1, wherein layout form of said two P-channel MOS transistors and four N-channel MOS transistors of said memory cell, and layout form of said first to sixth N-channel MOS transistors of said dummy memory cell are the same.

7. The static type semiconductor memory device according to claim 1, comprising:

a memory cell array including a plurality of memory cells arranged in a plurality of rows and columns, a plurality of word lines respectively provided corresponding to said plurality of rows, a plurality sets of first and second bit lines respectively provided corresponding to said plurality of columns, first and second dummy bit lines provided crossing said plurality of word lines, and a plurality of dummy memory cells provided at the crossing portion of said plurality of word lines and said first and second dummy bit lines;

a row selecting circuit selecting any one of said plurality of word lines in response to row address signal to change the word line to a select level for activating a plurality of memory cells and a dummy memory cell corresponding to the word line;

a column selecting circuit selecting any one set of said plurality sets of first and second bit lines in response to column address signal;

write/read circuit for writing and reading data signal to/from the memory cell activated by said row selecting circuit via the first and second bit lines selected by said column selecting circuit; and a potential sensing circuit outputting internal control signal in response to potential of said first dummy bit line being decreased lower than the predetermined threshold potential.

8. The static type semiconductor memory device according to claim 7, wherein a plurality sets of first and second dummy bit lines are provided, the number of N-channel MOS transistors used for reducing the potential of corresponding first dummy bit line to said ground potential in dummy cells corresponding to each set of first and second dummy bit lines is different from the number of N-channel MOS transistors used for reducing the potential of corresponding first dummy bit line to said ground potential in a dummy cell corresponding to other sets of first and second dummy bit lines; the static type semiconductor memory device further comprising:

a dummy bit line selecting circuit selecting one of said plurality of first dummy bit lines; wherein said potential sensing circuit outputs said internal control signal in response to potential of the first dummy bit line selected by said dummy bit line selecting circuit becoming lower than said threshold potential.

9. The static type semiconductor memory device according to claim 7, further comprising:

a redundant memory cell array including a spare word line provided crossing said plurality pairs of first and second bit lines and said first and second dummy bit lines, a plurality of memory cells respectively provided at a plurality of crossing portions of said plurality pairs of first and second bit lines and said spare word line, and a dummy memory cell provided at a crossing portion of said first and second dummy bit lines and said spare word line; wherein said row selecting circuit stores a row address signal corresponding to a defective row among said plurality of rows, and selects said spare word line in place of word line corresponding to an input row address signal when the input row address signal and the stored row address signal match.

* * * * *